(12) United States Patent
Betsuda et al.

(10) Patent No.: US 8,232,709 B2
(45) Date of Patent: Jul. 31, 2012

(54) LIGHT-EMITTING APPARATUS AND LUMINAIRE

(75) Inventors: Nobuhiko Betsuda, Yokosuka (JP); Kozo Ogawa, Yokosuka (JP); Shuhei Matsuda, Yokosuka (JP); Kiyoshi Nishimura, Yokosuka (JP); Nobuo Shibano, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 100 days.

(21) Appl. No.: 12/909,535

(22) Filed: Oct. 21, 2010

(65) Prior Publication Data

US 2011/0089805 A1  Apr. 21, 2011

(30) Foreign Application Priority Data

Oct. 21, 2009  (JP) ................. 2009-242119
Nov. 24, 2009  (JP) ................. 2009-266558
Oct. 13, 2010  (JP) ................. 2010-230675

(51) Int. Cl.
*H01J 1/02* (2006.01)
*H01J 1/62* (2006.01)
*H01J 63/04* (2006.01)

(52) U.S. Cl. ............. 313/46; 313/11; 313/483; 313/498

(58) Field of Classification Search ........................ None
See application file for complete search history.

(56) References Cited

U.S. PATENT DOCUMENTS

| 2,007,489 | A | 7/1935 | Westberg |
| 7,580,240 | B2* | 8/2009 | Yamamoto et al. ........... 361/311 |
| 2002/0125839 | A1 | 9/2002 | Yen |
| 2006/0227558 | A1 | 10/2006 | Osawa |
| 2007/0076413 | A1* | 4/2007 | Mingozzi .................. 362/249 |
| 2008/0084693 | A1 | 4/2008 | Shimada |
| 2008/0089071 | A1 | 4/2008 | Wang |
| 2008/0246383 | A1 | 10/2008 | Chang |
| 2010/0002455 | A1* | 1/2010 | Matsuoka et al. ........... 362/382 |
| 2011/0175548 | A1* | 7/2011 | Nishimura et al. ........... 315/294 |

FOREIGN PATENT DOCUMENTS

| DE | 202004003793 | 5/2004 |
| EP | 1772668 | 4/2007 |
| EP | 1950491 | 7/2008 |
| JP | 2005-79593 | 3/2005 |
| JP | 2008-140606 | 6/2008 |
| JP | 3146172 | 10/2008 |
| JP | 2009-037995 | 2/2009 |
| JP | 2009-54989 | 3/2009 |
| JP | 2009-212367 | 9/2009 |

(Continued)

OTHER PUBLICATIONS

English language abstract of JP 3146172 published Oct. 15, 2008.

(Continued)

*Primary Examiner* — Natalie Walford
(74) *Attorney, Agent, or Firm* — DLA Piper LLP (US)

(57) ABSTRACT

According to one embodiment, a light-emitting apparatus includes an insulating base made of ceramics, an obverse metallic component dividedly arranged on the front surface of the insulating base, semiconductor light-emitting elements mounted on the obverse metallic component, and a reverse metallic component arranged on a back surface of the insulating base and having a thickness same as or smaller than a thickness of the obverse metallic component and a volume equal to 50% or larger of a volume of the obverse metallic component.

5 Claims, 19 Drawing Sheets

FOREIGN PATENT DOCUMENTS

WO    WO2006/091538    8/2006

OTHER PUBLICATIONS

Machine English language translation of JP 3146172 published Oct. 15, 2008.
English Language Abstract of JP 2008-140606, published Jun. 19, 2008.
English Language Machine Translation of JP 2008-140606, published Jun. 19, 2008.
Extended European Search Report issued in corresponding European Patent Application No. 09014512.9 on Feb. 15, 2010.
English Language Abstract of DE 202004003793, published May 13, 2004.
Extended European Search Report issued in EP 10001621.1 on Jun. 17, 2010.
English language Abstract of JP 2009-037995, published Feb. 19, 2009.
Machine English language translation of JP 2009-037995, published Feb. 19, 2009.
English Abstract of JP 2005-79593 published Mar. 24, 2005.
English Translation of JP 2005-79593 published Mar. 24, 2005.
English Abstract of JP 2009-212367 published Sep. 17, 2009.
English Translation of JP 2009-212367 published Sep. 17, 2009.
English Abstract of JP 2009-54989 published Mar. 12, 2009.
English Translation of JP 2009-54989 published Mar. 12, 2009.
U.S. Appl. No. 12/708,564.
U.S. Appl. No. 12/788,348.
U.S. Appl. No. 12/623,906.
U.S. Appl. No. 12/973,992.

* cited by examiner

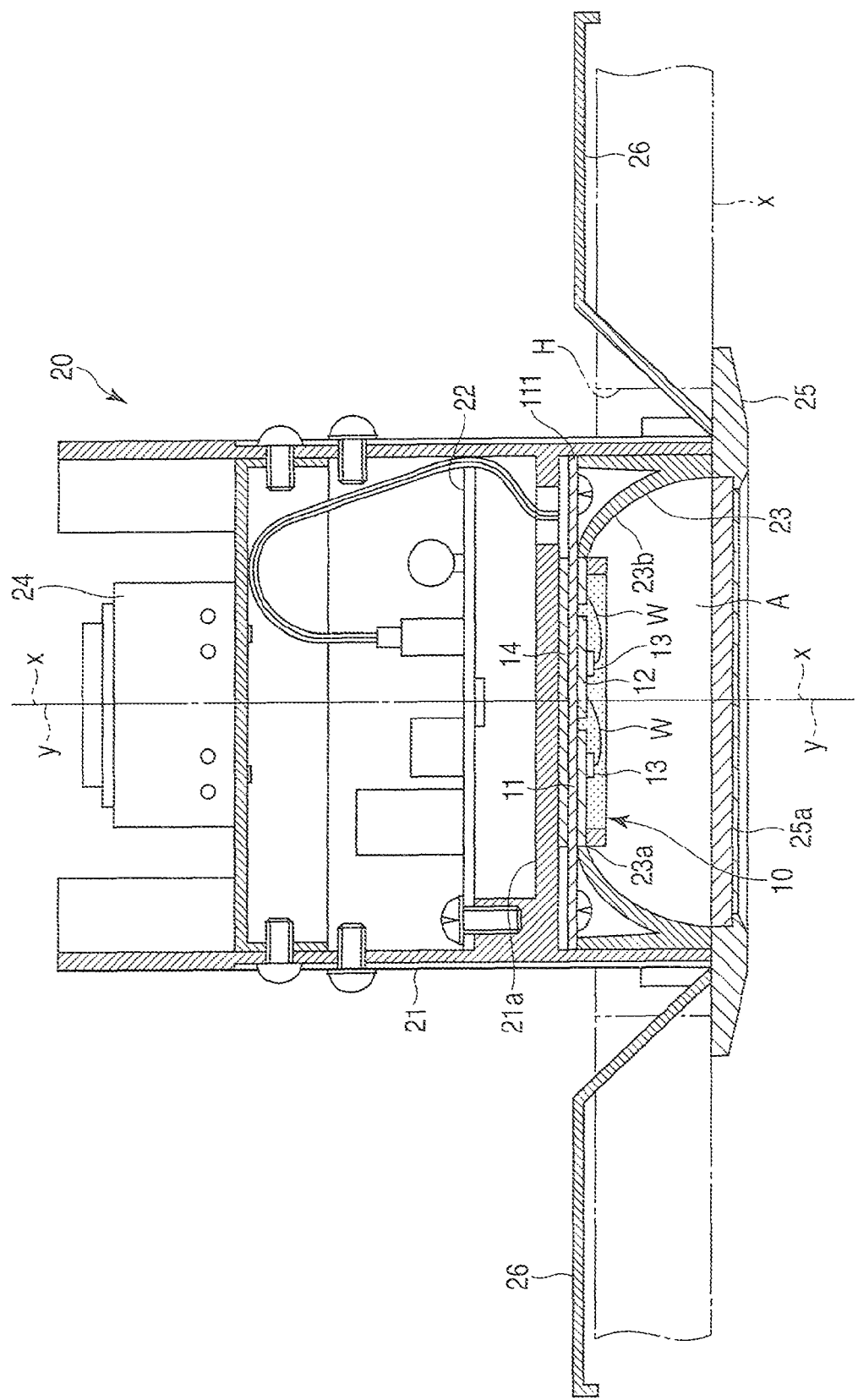
F I G. 2A

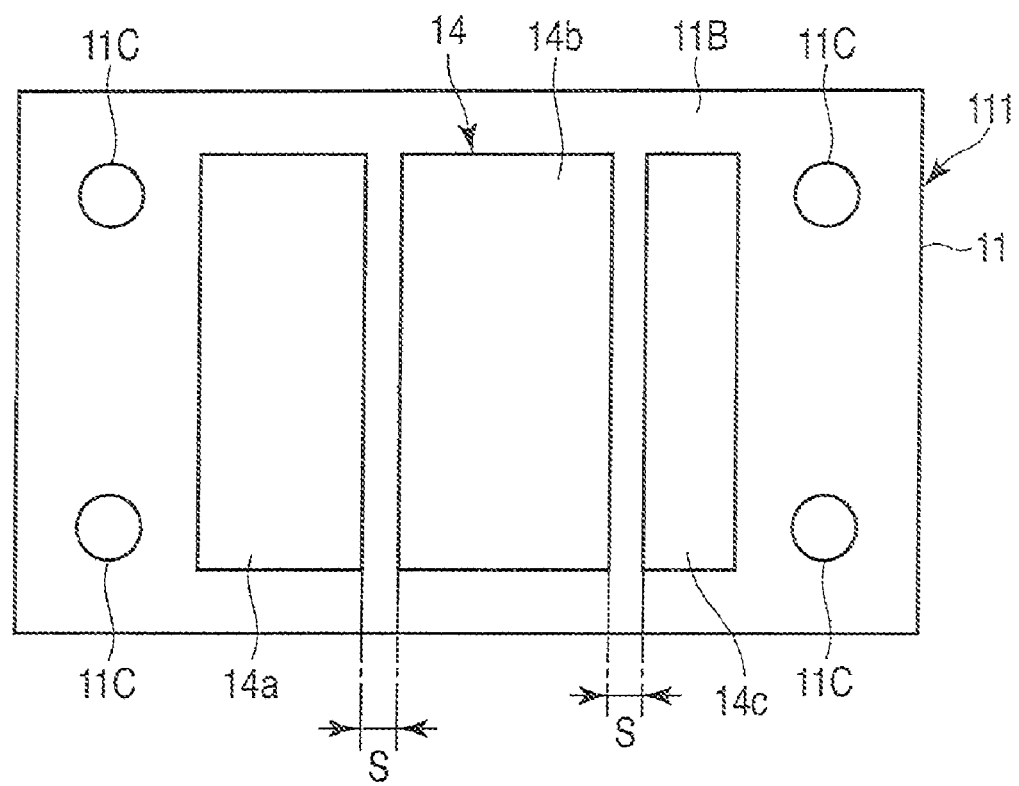
F I G. 3C

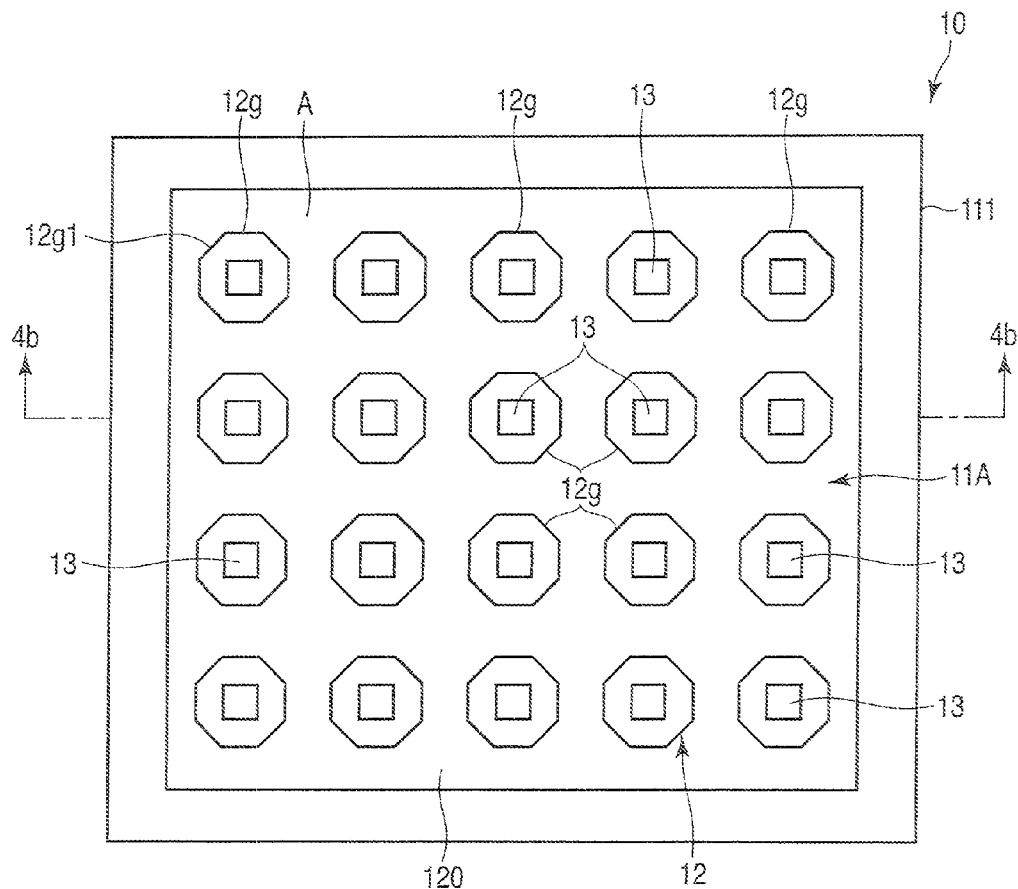
F I G. 4A
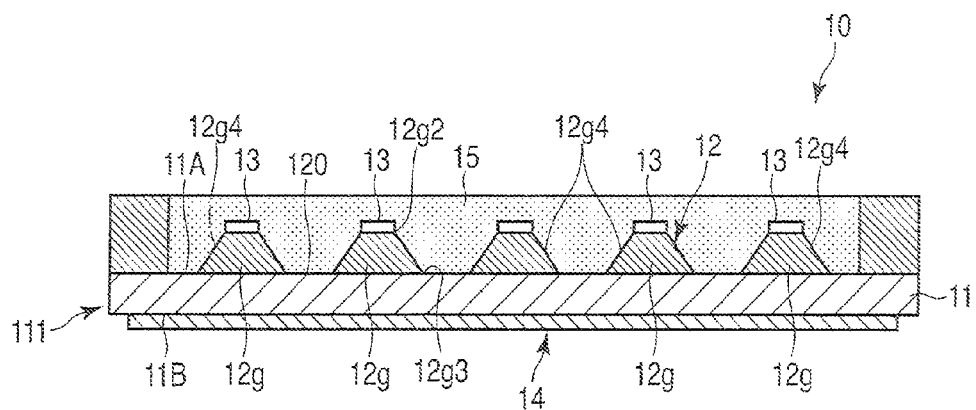
F I G. 4B

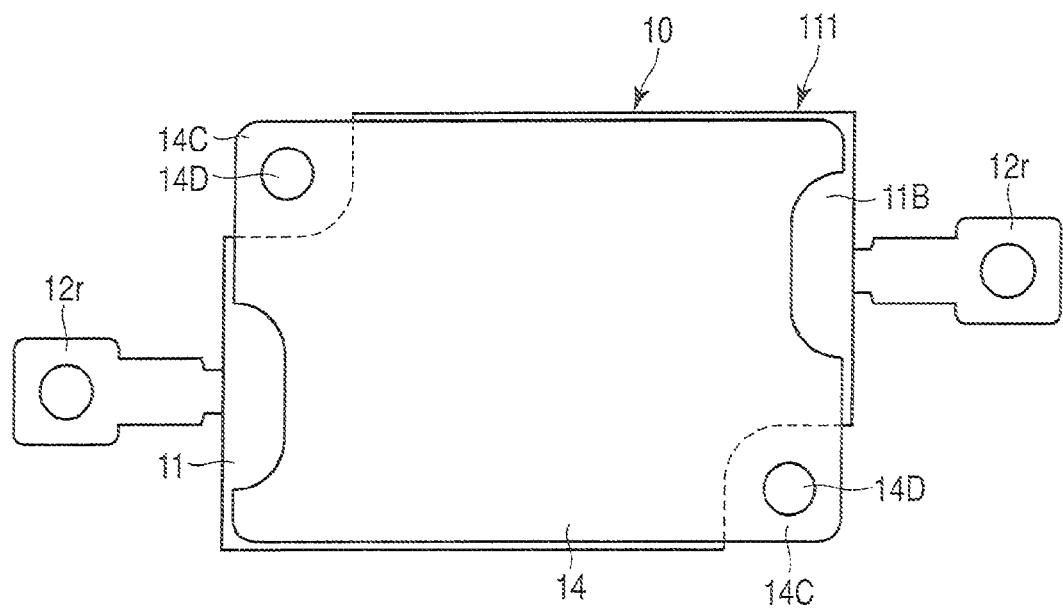
F I G. 12
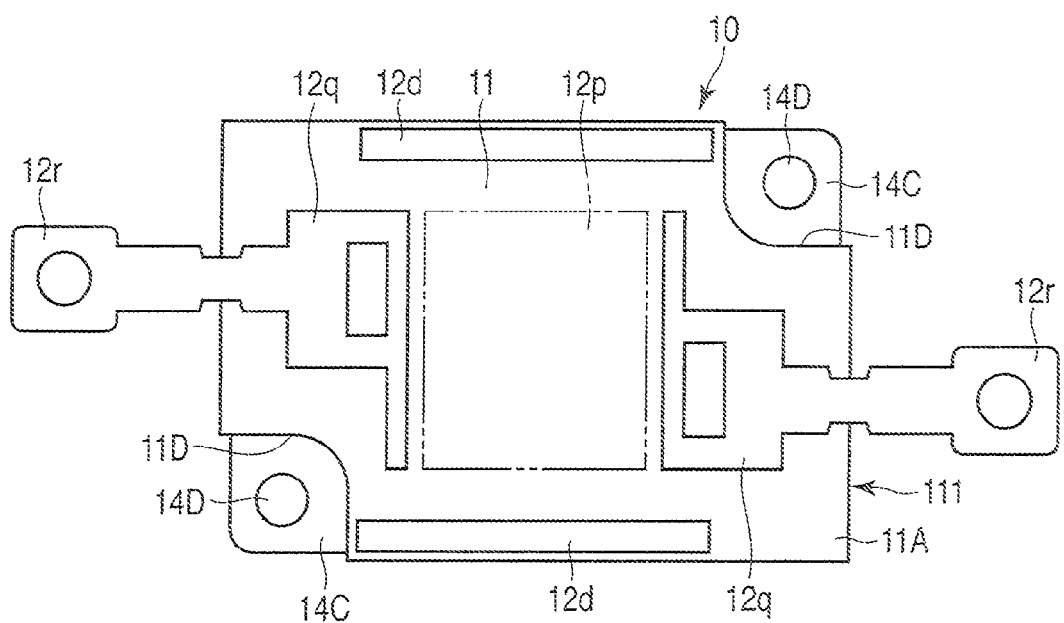
F I G. 13

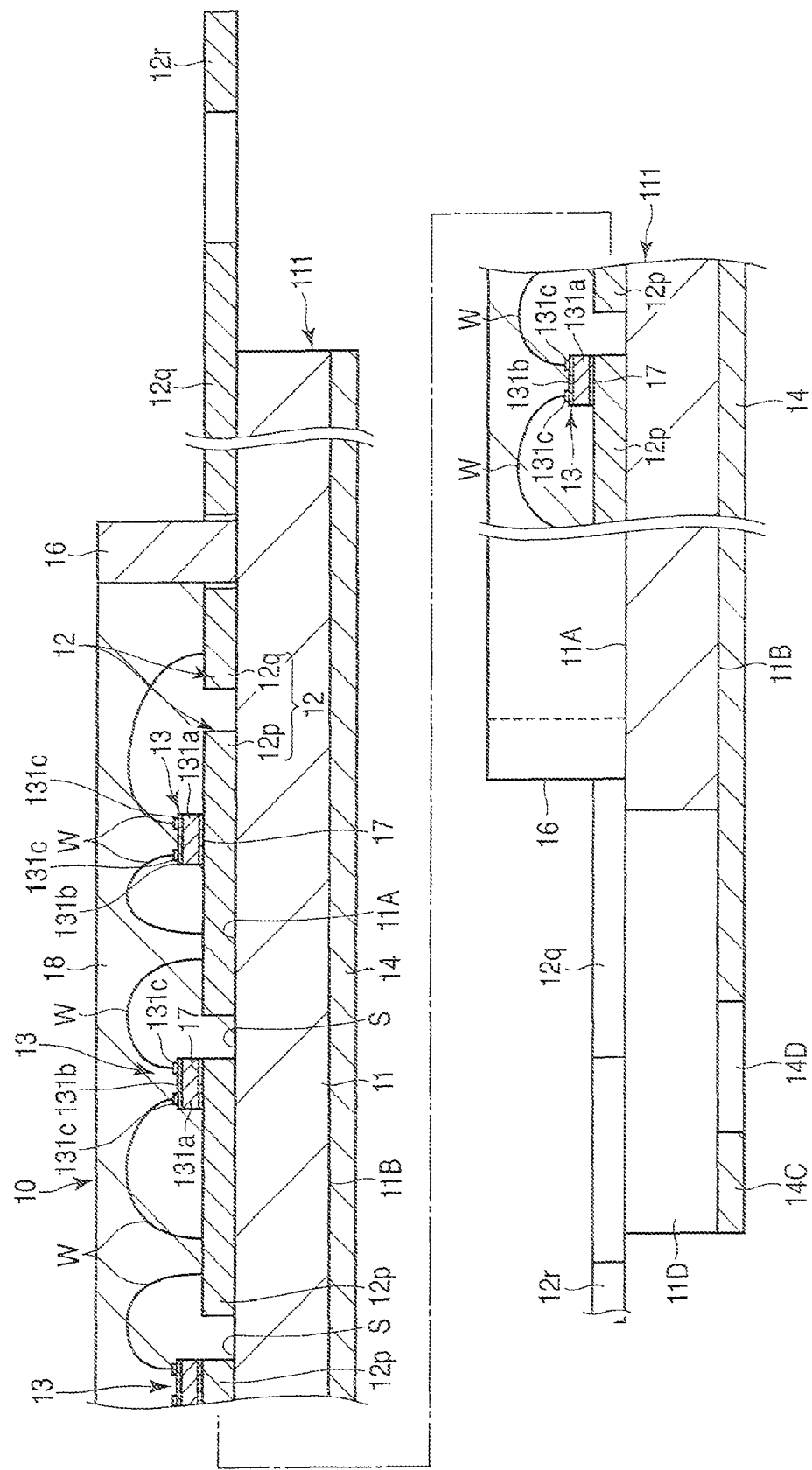
F I G. 14

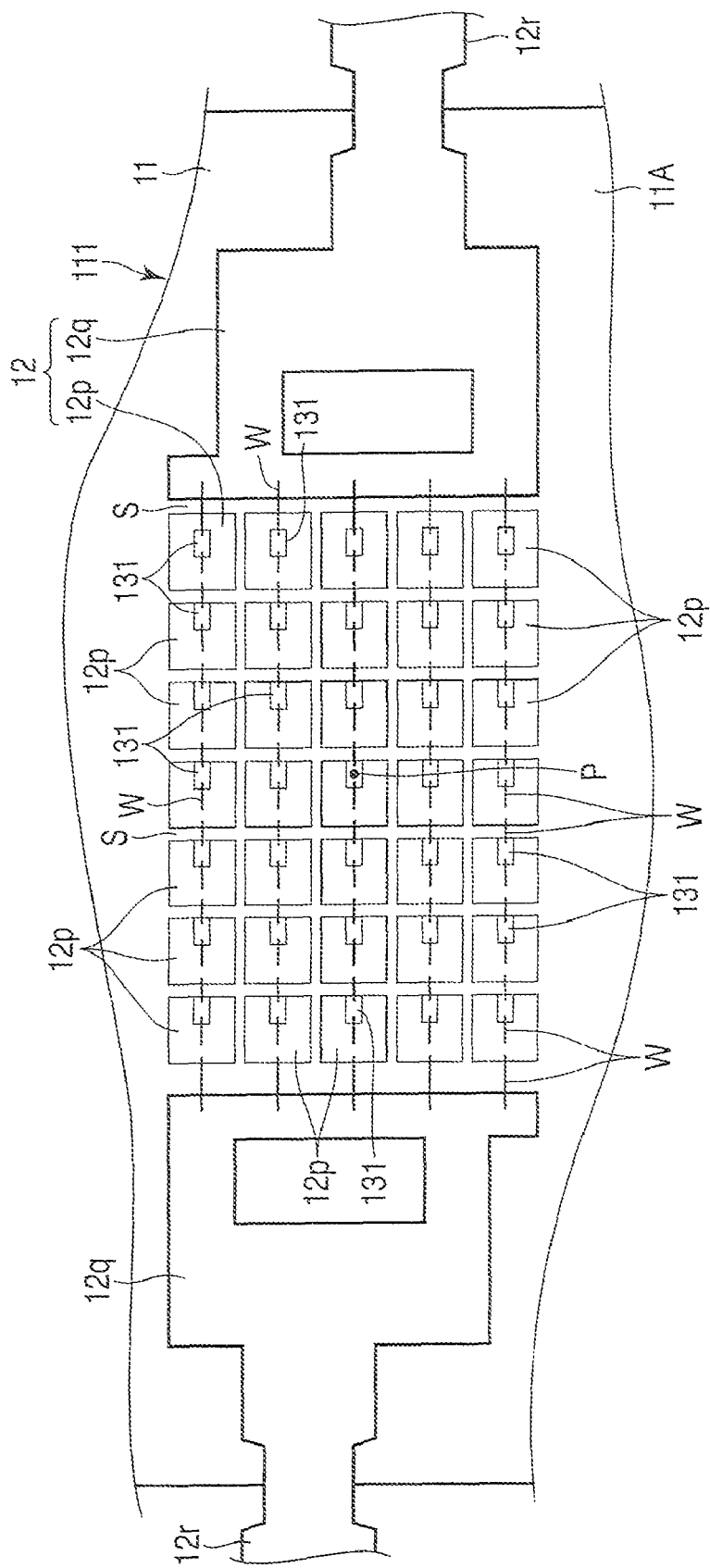
F I G. 15

LIGHT-EMITTING APPARATUS AND LUMINAIRE

CROSS-REFERENCE TO RELATED APPLICATIONS

This application is based upon and claims the benefit of priority from Japanese Patent Applications No. 2009-242119, filed Oct. 21, 2009; No. 2009-266558, filed Nov. 24, 2009; and No. 2010-230675, filed Oct. 13, 2010; the entire contents of all of which are incorporated herein by reference.

FIELD

Embodiments described herein relate generally to a light-emitting apparatus which has light-emitting semiconductor device, and a luminaire which is configured with the light-emitting apparatus.

BACKGROUND

There is a light-emitting apparatus which applies a light-emitting diode (LED) chip as a semiconductor light-emitting element for a light source. Since an emitting efficiency of the LED is improved, the LED is employed as a light source of a relatively large luminaire in an office and for general-purpose illumination. To increase an application of the LED as the light source, an LED having a high conversion efficiency and a high output is required. To realize the LED having a high output, it is important how to efficiently radiate the heat generated when the LED emits light.

There is a light-emitting apparatus which lights an LED chip by a power of 1 watt [W] or more. A substrate, which is formed with a first metal layer, an insulation core, and a second metal layer, is used as a substrate on which an LED chip is mounted. The insulation core is made of flat ceramics. The first metal layer is made of copper or aluminum excellent in, a conductive property to wire the LED chip, and forms a pattern on one surface of the insulation core. LED chips are mounted on the patterned first metal layer. The second metal layer is made of copper or aluminum excellent in thermal conductivity to transfer heat by being connected to a radiation component without bearing an electric connection function, and approximately integrally and flatly formed on a surface of the insulation core on a side opposite to the first metal layer. Since the light-emitting apparatus uses the material excellent in thermal conductivity as the second metal layer, the light-Omitting apparatus efficiently diffuses the heat generated by the LED in the substrate. Therefore, the light-emitting apparatus operates the LED by a large current in comparison with an apparatus which has no radiation function.

The first metal layer and the second metal layer are directly bonded or brazed, respectively. A substrate, which is configured by directly bonding the first metal layer and the second metal layer to the insulation core, is called a direct copper bonding (DCB) substrate. A substrate, which is configured by bonding the first metal layer and the second metal layer to the insulation core with lead-free solder, is called an active metal bonding (AMB) substrate. Since the insulation core and the first metal layer or the second metal layer, which configures the DCB substrate and the AMB substrate, are made of a different material, the insulation core and the first metal layer or the second metal layer naturally have a different thermal expansion rate and a different heat transfer speed. The first metal layer is a metal layer partly formed on the insulation core to form a wiring pattern. The second metal layer is a metal layer formed on an approximately overall surface thereof to exhibit a radiation operation. As described above, since the first metal layer and the second metal layer have a different pattern, the substrate is outstandingly warped in its entirety, when the first metal layer and the second metal layer are exposed to a high temperature atmosphere or an abrupt temperature change in a manufacturing stage.

A handling property is deteriorated in a process of manufacturing the light-emitting apparatus when the substrate is warped in its entirety. Further, a light-emitting apparatus, which is completed in a state that it is warped, cannot sufficiently obtain an area in contact with a case component for radiation and a radiation component such as a heat sink when the light-emitting apparatus is assembled to a luminaire. That is, the light-emitting apparatus cannot transfer the heat generated by an LED chip to the case component or the radiation component. Therefore, a light emitting efficiency is lowered and a luminous flux having a designed value cannot be obtained. Further, gaps are formed between the substrate and the case component or the radiation component when the substrate is warped. When the substrate is tightened more than necessary with a fastener such as a screw to eliminate the gaps, the substrate may be broken from a crack generated therein.

In the DCB substrate, a thickness of the first metal layer is increased to enhance a heat resistance. The second metal layer of the DCB substrate is thinner than the insulation core and bonded to a heat sink via a connection material such as solder, heat grease, phase change tape, or heat blanket. Alternatively, the DCB substrate includes a base which is thicker and wider than the second metal layer and connected to the second metal layer. The base is fastened to a heat sink and the like by bolts or rivets which are caused to pass through two cutouts formed in a peripheral portion. However, the number of parts increases and a cost becomes high, when the base is provided separately from the DCB substrate.

Solder has a melting temperature of about 230° C. even if the solder is lead-free solder, and the melting temperature is lower than a heat resistant temperature of an adhesive used to mounts an LED chip on the first metal layer. The solder may be deteriorated or cracked by high temperature creep and thermal stress fatigue, when a light-emitting apparatus is used under a high temperature environment or repeatedly subjected to a temperature change by being turned on and off, in the case that the second metal layer is attached to a heat sink using solder as a connection material. A power supplied to the LED chip needs to be suppressed so that a temperature of the DCB substrate does not become excessively high to keep a solder portion in a good state. However, this contradicts an increase in brightness of the LED chip.

As a method of directly fastening a heat sink to the DCB substrate, it is considered to fasten the heat sink to the DCB substrate by using a screw hole formed in an insulation core of the DCB substrate. However, the method is not preferable in two points described below. First, the insulation core may be broken, when the torque that tightens a screw is excessively strong, because the insulation core is made of ceramics. Second, since a second metal layer of the DCB substrate and the heat sink have a coefficient of linear expansion larger than that of the DCB substrate, the DCB substrate may be warped, when temperatures of the DCB substrate and the heat sink increase. In this case, the insulation core may be broken by stress concentrated on the screw hole. Accordingly, a technology is required that fastens the DCB substrate to a radiator such as the heat sink without using a base as a part separate from the light-emitting apparatus.

Further, there is a light-emitting apparatus that uses ceramics having a high thermal conductivity as a circuit board on which an LED is mounted. Generation of distortion in the circuit board is prevented by transferring the heat generated by the LED through the circuit board. The light-emitting apparatus has a metal attaching pattern formed on a side opposite to a side where the LED is mounted. The attaching pattern of the light-emitting apparatus is bonded to a radiation board opposed against the attaching pattern with lead-free solder. The radiation board is formed of the same material as the attaching pattern or a material having approximately the same thermal expansion rate as the attaching pattern to prevent generation of a crack when the attaching pattern is bonded to the radiation board with solder. The light-emitting apparatus includes an open region around a main bonding portion formed between the attaching pattern corresponding to a location where the LED is arranged and the radiation board. The open region prevents a crack from reaching the main bonding portion. However, in this light-emitting apparatus, prevention of overall warping of the substrate is not taken into consideration.

BRIEF DESCRIPTION OF THE DRAWINGS

FIG. 2A is a sectional view of a luminaire including the light-emitting apparatus shown in FIG. 1A;

FIG. 3C is a back surface view of the light-emitting apparatus shown in FIG. 3A;

FIG. 4A is a plan view of a light-emitting apparatus of a third embodiment as viewed from the light radiation side;

FIG. 4B is a sectional view of the light-emitting apparatus taken along a line 4b-4b in FIG. 4A;

FIG. 12 is a back surface view of the light-emitting apparatus shown in FIG. 11;

FIG. 13 is a front elevational view of the light-emitting apparatus shown in FIG. 11 in a state before an LED chip is mounted on the light-emitting apparatus;

FIG. 14 is a sectional view of the light-emitting apparatus taken along a line F14-F14 in FIG. 11;

FIG. 15 is a plan view of arrangement of LED chips of the light-emitting apparatus shown in FIG. 11.

DETAILED DESCRIPTION

Figure 1A:
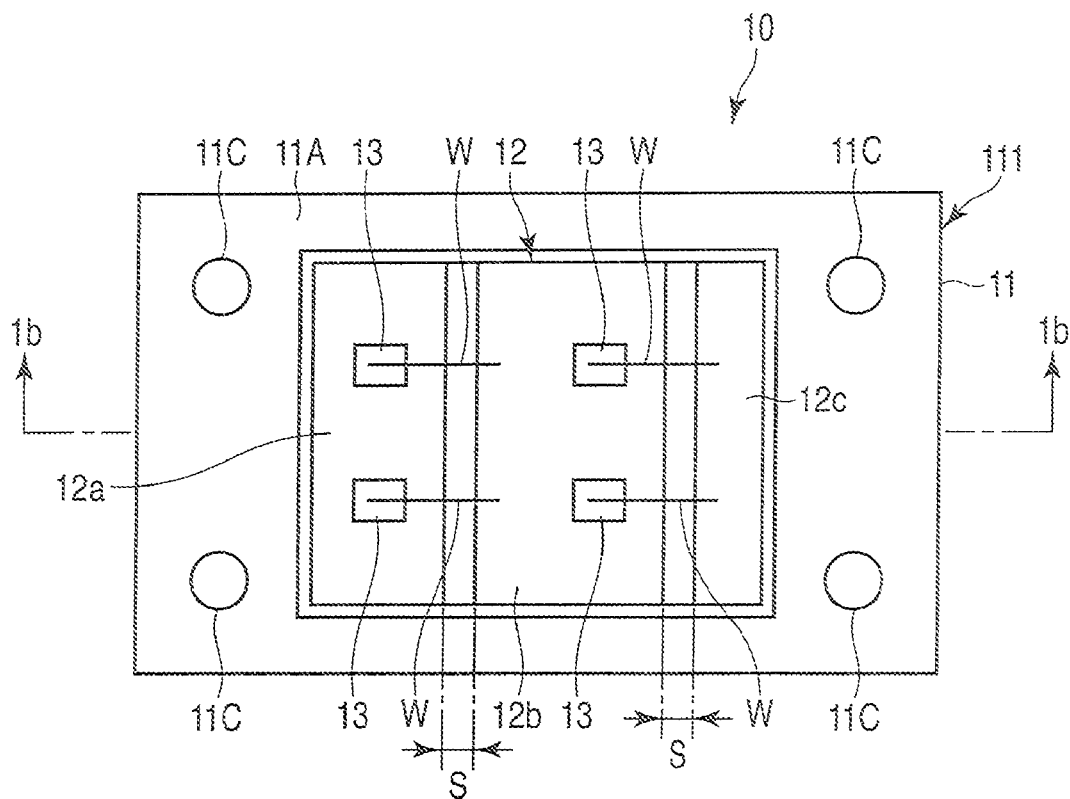
FIG. 1A is a plan view of a light-emitting apparatus of a first embodiment as viewed from a light radiation side.

In general, according to an embodiment, a light-emitting apparatus in which a ceramics substrate is not warped by heat, or the light-emitting apparatus which is easily fastened to an attachment portion without increasing the number of parts are disclosed. Also, a luminaire that includes the light-emitting apparatuses is shown.

A light-emitting apparatus of an embodiment includes an insulating base, an obverse metallic component, semiconductor light-emitting elements, and a reverse metallic component. The insulating base is made of ceramics. The obverse metallic component is dividedly arranged on a front surface of the insulating base. The semiconductor light-emitting elements are mounted on the obverse metallic component. The reverse metallic component is formed on a back surface of the insulating base so as to have a thickness the same as or smaller than that of the obverse metallic component. A volume of the reverse metallic component is set to 50% or larger of a volume of the obverse metallic component. Further, an area of the reverse metallic component is set larger than an area of the obverse metallic component.

The insulating base, the obverse metallic component, and the reverse metallic component configure a substrate. As the substrate, a direct copper bonding (DCB) substrate, a direct brazing aluminum (DBA) substrate, an active metal brazed copper (AMC) substrate, and the like are available. The DCB substrate is formed by directly bonding a copper plate that functions as the reverse metallic component to the ceramic insulating base. The DBA substrate is formed by brazing an aluminum plate that functions as the reverse metallic component to the ceramic insulating base. The AMC substrate is formed by brazing a copper plate that functions as the reverse metallic component to the ceramic insulating base.

The insulating base is a component on which the semiconductor light-emitting element that functions as a light source such as a light-emitting diode (LED) chip is disposed, and sintered materials and the like that are made of aluminum nitride (AlN), silicon nitride (SiN), alumina ($Al_2O_3$) and compounds mainly composed of alumina ($Al_2O_3$) and zirconia ($ZrO_2$) are allowed. Employed as a shape of the insulating base is all the shapes that satisfy required light distribution characteristics, a plane module formed by disposing a plurality of LED chips at predetermined intervals, i.e. a polygon shape such as square, rectangle, hexagon, octagon that is made by cutting four corners of a square, a round shape such as a circle and an ellipse, or a line module formed by disposing LED chips on a long line.

In the specification, a surface of the insulating base on a side where the LED chips are mounted and light is radiated therefrom is called "front" or "obverse" and a surface of the insulating base on an opposite side of the front is called "back" or "reverse" for convenience to describe.

The obverse metallic component formed on the front surface of the insulating base forms wiring patterns. The LED chip as the semiconductor light-emitting element is disposed on the wiring pattern. A method of manufacturing the insulating base and a method of mounting the LED chips are not restricted to specific methods. When the obverse metallic component having set patterns is formed on the insulating base, a primary component, which remains a bridge that couples the set patterns with respective parts, is prepared first by punching with dies from a metal sheet. The obverse metallic component is obtained by cutting off and removing unnecessary portion such as the bridge after the primary component is bonded to the ceramic insulating base. Alternatively, the metal component is etched to the set patterns after a metal sheet is bonded to the ceramic insulating base.

Any materials such as copper, copper alloys, aluminum, and aluminum alloys are allowed as a material of the obverse metallic component as long as the materials are excellent in a conductive property. Whether the obverse metallic component is partly or entirely disposed in the insulating base in a matrix state that has predetermined intervals, partly or entirely disposed, regularly with a predetermined order such as in zigzag, radially, and spirally, or disposed at random by these metals is not restricted.

In addition to that the light-emitting elements are configured of the LED chips, light-emitting elements using a semiconductor laser, an organic electroluminescence (EL), and the like as the light source are used also as the semiconductor light-emitting elements. A necessary number of the semiconductor light-emitting elements is selected according to use of illumination, that is, a plurality of semiconductor light-emitting elements may be mounted on one obverse metallic component or only one semiconductor light-emitting element may be mounted on one obverse metallic component. Color of the semiconductor light-emitting elements used for the light source is set according to use of a luminaire. That is, when the semiconductor light-emitting elements are configured to radiate white light, the semiconductor light-emitting elements are configured of monochrome color or synthesized color in which plural colors of red, blue, green, yellow, and the like are combined.

The reverse metallic component formed on the back surface of the insulating base is formed to have a thickness the same as or smaller than that of the obverse metallic component and used to fasten the light-emitting apparatus to a radiation component such as a case or a heat sink. The reverse metallic component does not ordinarily have an electric connection function and is configured to exhibit a radiation function. Accordingly, all the metals excellent in the thermal conductivity such as silver, copper, copper alloys, aluminum, and aluminum alloys can be used as the reverse metallic component. The reverse metallic component formed of these metals is configured into a continuous flat sheet in consideration of a radiation property. The reverse metallic component is not necessarily formed entirely continuously but may be partly cut out or divided to portions.

The obverse metallic component and the reverse metallic component are metals formed into a thin sheet and brazed to the ceramic insulating base. The metal sheets may be directly surface bonded to the ceramic insulating base by diffusion bonding or eutectic bonding in place of brazing the metal sheets. When a copper foil is diffusion bonded to ceramics, an oxidized copper foil is disposed on the ceramic insulating base and bonded thereto by being heated to about 1070 degrees centigrade [° C.] and pressurized. Further, the obverse metallic component and the reverse metallic component may be thin metal layers formed by electric plating and etching.

A ratio of volume of the reverse metallic component to the obverse metallic component may be set based to 50% or more based on a volume of the obverse metallic component by adjusting a thickness of the reverse metallic component, or the ratio of volume of the reverse metallic component to the obverse metallic component may be set to 50% or more based on a volume of the reverse metallic component by adjusting a thickness of the obverse metallic component. Further, in the adjustment of the ratio of volume of the obverse metallic component and the reverse metallic component, the ratio of volume may be set by setting the obverse metallic component and the reverse metallic component to the same thickness and changing surface areas of the obverse metallic component and the reverse metallic component or may be set by setting the same surface area to the obverse metallic component and the reverse metallic component and changing the thicknesses of the obverse metallic component and the reverse metallic component. Further, in the adjustment of the ratio of volume of the obverse metallic component and the reverse metallic component, the ratio of volume may be set by combining the thicknesses and the surface areas of both of the obverse metallic component and the reverse metallic component.

The volume of the obverse metallic component may be set only by the obverse metallic component on which the semiconductor light-emitting elements are mounted or may be set including components that configure terminal portions, on which the semiconductor light-emitting elements are not mounted, and frames for reinforcing the insulating base. Likewise, the volume of the reverse metallic component may be set by components within a range corresponding to the obverse metallic component or may be set including the components that configure the terminal portions and the components that configure the frames for reinforcing the insulating base. The components that configure the terminal portions on which the semiconductor light-emitting elements are not mounted and the components that configure the frames for reinforcing the insulating base may be configured of the same material as the obverse metallic component and the reverse metallic component or may be configured of a different material.

The ratio of volume of the reverse metallic component to the obverse metallic component is preferably set close to 100% in a range of 50% to 120%. A heat capacity difference between the obverse metallic component and the reverse metallic component caused by a volume is increased when the ratio of volume is less than 50%, thus it becomes difficult to prevent warping of the insulating base. Since a bonding temperature at which the obverse metallic component and the reverse metallic component are bonded to the insulating base is high, i.e. about 1070 degrees centigrade [° C.], the substrate is warped so as to swell a central portion of the substrate to a front side after the obverse metallic component and the reverse metallic component are cooled to a room temperature when the ratio of volume exceed 120%. It becomes difficult for the reverse metallic component to fit to a portion where the light-emitting apparatus is fastened.

The obverse metallic component is formed in patterns according to the arrangement of the semiconductor light-emitting elements. Since the area of the reverse metallic component is larger than the area of the obverse metallic component, a thickness of the reverse metallic component is made smaller than a thickness of the obverse metallic component. The volume of the obverse metallic component is made approximately the same as the volume of the reverse metallic component by making the thickness of the obverse metallic component larger than the thickness of the reverse metallic component. Warping occurred in the insulating base is suppressed by reducing a difference between expansion and contraction of the obverse metallic component and the reverse metallic component which is caused by a temperature change.

Parts of the obverse metallic component include long strip-shaped portions along a peripheral portion of the insulating base. Since the strip-shaped portions of the Obverse metallic component function as reinforcing frames in the peripheral portion of the insulating base, the reinforcing frames prevent warping of the substrate in its entirety and prevent cracking in the peripheral portion. The strip-shaped portions are arranged avoiding the terminal portions arranged in the peripheral portion of the substrate. That is, the strip-shaped portions are arranged along a long side avoiding the terminal portion so as to be arranged symmetrically, when the substrate is rectangular and the terminal portions are disposed along a short side of the substrate. The substrate is reinforced by effectively using a dead space on a front side of the substrate without widening the substrate. The strip-shaped portions may be continuously formed in an overall periphery of the substrate or may be partly discontinuously formed. The strip-shaped portions of the obverse metallic component only need to function as the reinforcing frames. Accordingly, the strip-shaped portions may be formed of the same metal material at the same time as the obverse metallic component on which the semiconductor light-emitting elements are mounted is formed or may be formed of a different metal material in a different process.

Further, in the light-emitting apparatus, the insulation base includes screw fastening holes and reinforcing portions, which are included in parts of the obverse metallic component, around the holes on a front surface. Since the parts of the obverse metallic component are arranged as the reinforcing portions around the holes, the reinforcing portions serve as the reinforcing frames of the holes, that is, the reinforcing portions prevent cracking in the insulation base when screws are tightened. The reinforcing portions may be continuously formed around the holes without being separated from each other or may be partly discontinuously formed. Further, the reinforcing portions are formed of the same metal material at the same time as the obverse metallic component, on which the semiconductor light-emitting elements are mounted as electrode portions, and the obverse metallic component, which forms the reinforcing frames of the peripheral portion as the strip-shaped portions, are formed, or the reinforcing portions are formed of a different component in a different process.

A light-emitting apparatus of another embodiment includes a ceramic insulating base, an obverse metallic component, a reverse metallic component, and semiconductor light-emitting elements. In the insulating base, a front surface on which the semiconductor light-emitting elements are mounted and a back surface on a side opposite to the front surface are defined. The obverse metallic component is directly bonded, or brazed to the front surface of the insulating base in set patterns. The obverse metallic component includes pads and power supply portions. Each pad supports at least one semiconductor light-emitting element. The power supply portions are arranged in a peripheral portion of the insulating base and include terminal portions that supply power to the semiconductor light-emitting elements. The reverse metallic component includes a fastening portion integrally therewith that extends along the back surface Of the insulating base beyond a peripheral edge of the insulating base and is directly bonded or brazed to the back surface of the insulating base. A screw-passing portion is formed in the fastening portion. The insulating base, the obverse metallic component, and the reverse metallic component configure a substrate. The semiconductor light-emitting elements are mounted on the pads of the obverse metallic component and electrically connected to the power supply portions.

The power supply portions are formed like tabs projecting from a peripheral edge of the insulating base made of ceramics or the like to the outside. Alternatively, openings, which are made of holes or grooves, are formed in a part of the insulating base, and the power supply portions are formed to close the openings.

When an edge portion of the reverse metallic component projects beyond a peripheral portion of the ceramic insulating base, the screw-passing portion used as the fastening portion is formed in the edge portion. A region of the edge portion of the reverse metallic component excluding the fastening portion is formed in a size substantially the same as the insulating base, that is, only the fastening portion projects beyond the peripheral portion of the insulating base. The edge portion of the reverse metallic component, which is exposed to a recess portion formed by cutting off a part of the peripheral portion of the insulating base, is used as the fastening portion. The reverse metallic component is not restricted to a flat sheet having a uniform thickness. Holes and slits are formed in the reverse metallic component according to patterns of the obverse metallic component. That is, the holes and the cutouts are formed corresponding to a distribution of density of the patterns of the obverse metallic component.

In the light-emitting apparatus, since the reverse metallic component is directly bonded or brazed to the back surface of the insulating base, a thick sheet-shaped reverse metallic component is used. The fastening portion, which is formed integrally with the reverse metallic component and in which the screw-passing portion is formed, has a strength sufficient to fasten the substrate to a settled-component such as a heat sink with screw. Since the fastening portion swells beyond the peripheral portion of the ceramic insulating base, the substrate is fastened to the settled-component without passing a screw through the insulating base. Since the fastening portion is formed integrally with the reverse metallic component, a additional part is not necessary for the fastening portion. Accordingly, the substrate is fastened to the settled-component with screw without increasing the number of parts, and the insulating base is not broken even if it is tightened with screw.

The light-emitting apparatus described above is applied not only as a light source of a relatively large luminaire which is used in a facility such as an office whose overall area is illuminated from a ceiling and which is used for a business but also as a light source of a small luminaire such as a luminaire for an ordinary house and a lamp-shaped luminaire having a base. The business-use luminaire employed in an office, a facility, and the like is made in a long shape or in a large panel shape by combining the light-emitting apparatuses. The luminaire for an ordinary house, which is smaller than the business-use luminaire, is made of at least one light-emitting apparatus.

A luminaire includes a light-emitting apparatus for a light source, a case having a radiation function, a lighting circuit and a power supply circuit for turning on LED chips of the light-emitting apparatus. The light-emitting apparatus is fastened by bringing a reverse metallic component into contact with a heat transfer surface prepared in a case. A paste and a silicone grease are filled between the reverse metallic component and the heat transfer surface to enhance a heat transfer. The case is made of a material excellent in a thermal conductivity, that is, metals such as a steel, stainless steel, and aluminum and synthetic resins having heat resistance, light fastness, and an electric insulation property, that is, polybutylene terephthalate (PBT) and the like. The lighting circuit and the power supply circuit transform an alternating-current voltage in a range between 100 volts and 300 volts to a desired direct-current voltage, and supply the desired direct-current voltage to the LED chips. The lighting circuit and the power supply circuit are located in the case or installed away from the case. Further, the lighting circuit may include a lighting control function that changes brightness and emission color.

As described above, the light-emitting apparatus is configured such that the thickness of the reverse metallic component is made equal to or smaller than the thickness of the obverse metallic component, and the ratio of volume of the obverse metallic component to the volume of the reverse metallic component is set to 50% or more. With the configuration, the light-emitting apparatus suppresses warping occurred in the insulating base in the manufacturing process due to an area difference between the obverse metallic component and the reverse metallic component. Further, in the light-emitting apparatus, warping which is occurred in the insulating base in the manufacturing process is further reduced when a laying area of the reverse metallic component is made larger than the area of the obverse metallic component.

Since the strip-shaped portions formed in the peripheral portion of the insulating base are included in the parts of the obverse metallic component and the strip-shaped portions function as the reinforcing frames for the peripheral portion of the insulating base, the strip-shaped portions prevent warping of the insulating base and prevent cracking in the peripheral portion. Since the reinforcing portions formed around a mounting holes for thread fastening are included in the obverse metallic component and function as the reinforcing frames of the mounting holes, the reinforcing portions prevent cracking from the mounting holes.

In the light-emitting apparatus of the other embodiment, a screw is passed though the screw-passing portion of the fastening portion formed integrally with the reverse metallic component directly bonded or brazed to the back surface of the insulating base and fastens the substrate to the settled-component. The light-emitting apparatus obtains a structure in which the substrate can be fastened to the settled-component with screw without increasing the number of the parts. The ceramic insulating base is not broken, even if the screw is tightened strong. Further, the light-emitting apparatus includes the fastening portion formed as a part of the reverse metallic component. It is not necessary to be anxious about breakage of the ceramic insulating base when the substrate is fastened to the settled-component with screw without increasing the number of parts.

Light-emitting apparatuses and luminaires of first to fifth embodiments will be explained below.

Figure 1B:
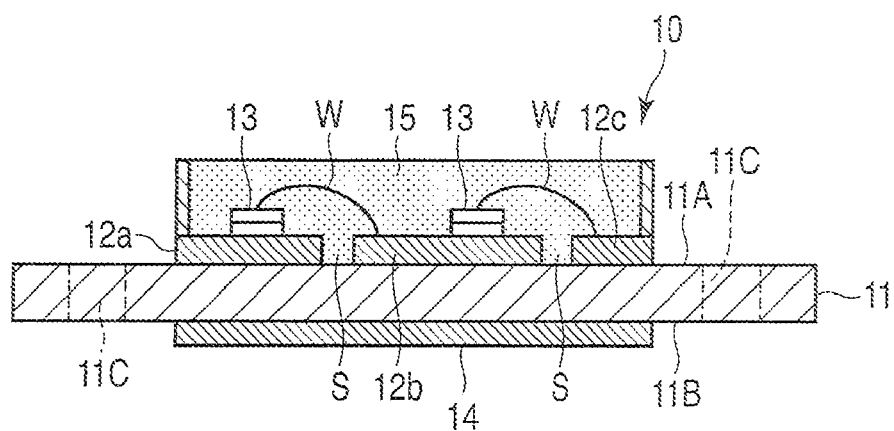
FIG. 1B is a sectional view of the light-emitting apparatus taken along a line 1b-1b in FIG. 1A.

A configuration of a light-emitting apparatus 10 of a first embodiment will be explained. The light-emitting apparatus 10 shown in FIG. 1A is configured by mounting light-emitting diodes (LEDs) as semiconductor light-emitting elements 13 on a DCB substrate. As shown in FIG. 1B, the light-emitting apparatus 10 includes a ceramic insulating base 11, an obverse metallic component 12 formed on a front surface 11A of the insulating base 11, semiconductor light-emitting elements 13 configured of the LEDs and mounted on the obverse metallic component 12, and a copper reverse metallic component 14 made of copper and formed on a back surface 11B of the insulating base 11. A substrate 111 is configured of the insulating base 11, the obverse metallic component 12, and the reverse metallic component 14.

The insulating base 11 is a rectangular flat plate composed of ceramics, which is aluminum nitride in this embodiment, to dispose the semiconductor light-emitting elements 13 thereon. The obverse metallic component 12 is formed on the front surface 11A of the insulating base 11 to configure wiring patterns. In FIG. 1A, mounting holes 11C for thread fastening, which fasten the light-emitting apparatus 10 to a case 21 of a luminaire 20 shown in FIG. 2A, are formed in four corners of the insulating base 11.

The obverse metallic component 12 is disposed on the front surface of the ceramic insulating base 11 by being divided to three portions which are disposed side by side in a longitudinal direction of the insulating base 11. In FIG. 1A, pads 12a, 12b, 12c, which configure the patterns of the obverse metallic component 12 and have electric insulation intervals S, are disposed in a central region of the insulating base 11 and bonded to the front surface 11A of the insulating base 11 with solder as shown in FIG. 1B. Surfaces of the respective pads 12a, 12b, 12c are plated with nickel (Ni) to prevent oxidation. Gold (Au), silver (Ag), and the like may be plated in place of nickel. Since these metals are plated so as to cover the surfaces of the pads 12a, 12b, 12c, the plated metals effectively reflect the light radiated from the semiconductor light-emitting elements 13. Since a loss of the radiated light is reduced, a light emitting efficiency of the light-emitting apparatus 10 is improved. Although a reflectance of a non-plated copper is about 60%, a reflectance of silver plating is about 95%.

The semiconductor light-emitting elements 13 are mounted on a surface of the obverse metallic component 12. The semiconductor light-emitting elements 13 are configured of the LED chips. Plural pieces of semiconductor light-emitting elements having the same performance are prepared as the semiconductor light-emitting elements 13. In the embodiment, the respective semiconductor light-emitting elements 13 are configured of blue LED chips having high brightness and high output. Two pieces each of the blue semiconductor light-emitting elements 13 are arranged in each of the pads 12a, 12b in matrix at approximately uniform intervals. In the embodiment, since the substrate is configured of the DCB substrate, the semiconductor light-emitting elements 13 employ LED chips that is square shape having one side of about 1 mm and a large capacity of about 1.1 to 1.5 W.

As shown in FIG. 1B, the respective semiconductor light-emitting elements 13 mounted on the obverse metallic component 12 are covered with seal components 15 configured of a transparent silicone resin blended with a yellow fluorescent material. The yellow fluorescent material is excited by the blue semiconductor light-emitting elements 13 and emits yellow light. The light-emitting apparatus 10 emits white light by mixing the yellow light emitted by the yellow fluorescent material with blue light emitted by the semiconductor light-emitting elements 13. The semiconductor light-emitting elements 13 are connected to the respective pads 12a, 12b by gold bonding wires W, and two pieces each of the four semiconductor light-emitting elements 13 are connected in series.

Figure 1C:
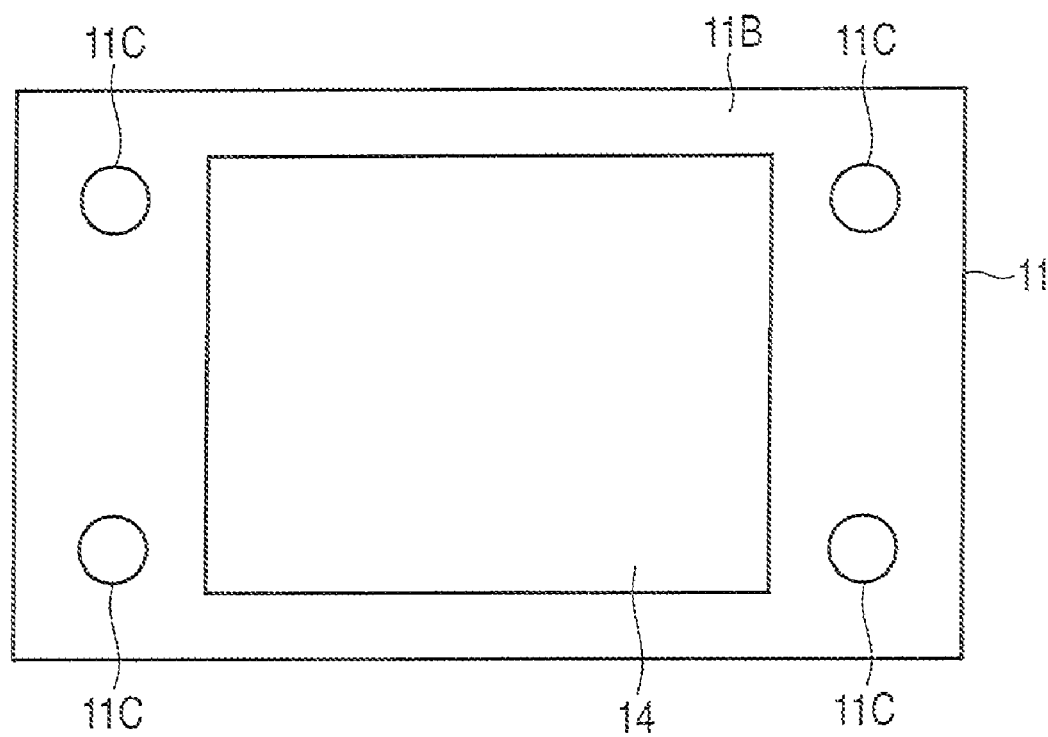
FIG. 1C is a back surface view of the light-emitting apparatus shown in FIG. 1A.

Further, a sheet thickness of the copper reverse metallic component 14 formed on the back surface 11B of the ceramic insulating base 11 is smaller than a sheet thickness of the copper obverse metallic component 12 formed on the front surface 11A of the insulating base 11. As shown in FIG. 1C, the reverse metallic component 14 is a continuous flat sheet and bonded to the back surface 11B of the insulating base 11 with solder.

In the light-emitting apparatus 10 including the DCB substrate, a volume of the reverse metallic component 14 is made 50% or more with respect to a volume of the obverse metallic component 12. In the embodiment, the insulating base 11, the obverse metallic component 12, and the reverse metallic component 14 are configured to have the following sizes and volumes.

In FIG. 1A, the pad 12a shown on a left side is configured to have a sheet thickness of about 0.25 mm and an area of about 40 mm$^2$, the pad 12b in a central portion is configured to have a sheet thickness of about 0.25 mm as same as the left side and an area of about 60 mm$^2$, and the pad 12c on a right side is configured to have a sheet thickness of about 0.25 mm and an area of about 20 mm$^2$. That is, the obverse metallic component 12 is configured to have a sheet thickness of about 0.25 mm and a total area of about 120 mm$^2$. Further, the reverse metallic component 14 is configured to have a sheet thickness of about 0.2 mm that is smaller than the sheet thickness of the obverse metallic component 12 and an area of about 140 mm$^2$. The insulating base 11 is configured of aluminum nitride having a sheet thickness of about 0.25 mm and an area of about 322 mm$^2$ that is larger than an area of a copper sheet of the reverse metallic component 14 on the back surface, and the reverse metallic component 14 is bonded to the insulating base 11 so that a blank region remains in a peripheral portion as shown in FIG. 1C.

The volume of the obverse metallic component 12 becomes about 30 mm$^3$ and the volume of the reverse metallic component 14 becomes about 28 mm$^3$ based on the sizes described above. The reverse metallic component 14 and the obverse metallic component 12 are configured so that a ratio of volume of the reverse metallic component 14 to the obverse metallic component 12 becomes about 93%, falling within a target ratio of volume of 50% or more and close to 100%.

In the embodiment, warping of the insulating base 11 is controlled by forming the obverse metallic component 12 and the reverse metallic component 14 so that the ratio of volume of the reverse metallic component 14 to the obverse metallic component 12 becomes close to 100% by setting the sheet thickness of the obverse metallic component 12 and forming the sheet thickness of the reverse metallic component 14 smaller than a thickness of the obverse metallic component 12, that is, by adjusting the sheet thickness and a surface area of the reverse metallic component 14.

As described above, the light-emitting apparatus 10 is configured to eliminate a thermal capacity difference between both sides of the ceramic insulating base 11 as much as possible by eliminating a thermal expansion rate difference between both surfaces of the insulating base 11, by making the obverse metallic component 12 and the reverse metallic component 14 of the copper sheet that is the same material, and by setting the ratio of volume of the reverse metallic component 14 to the obverse metallic component 12 to about 93%. As a result, the light-emitting apparatus 10, which suppresses warping occurred in the insulating base 11 by heat, is configured.

According to the light-emitting apparatus 10, in a manufacturing process, the substrate 111 is unlikely to be warped, even if the substrate is exposed to a high temperature atmosphere of about 300° C. when the semiconductor light-emitting elements 13 are mounted on the obverse metallic component 12 by die bonding. Further, a concern that a handling property is deteriorated in the manufacturing process is also improved.

Figure 2B:
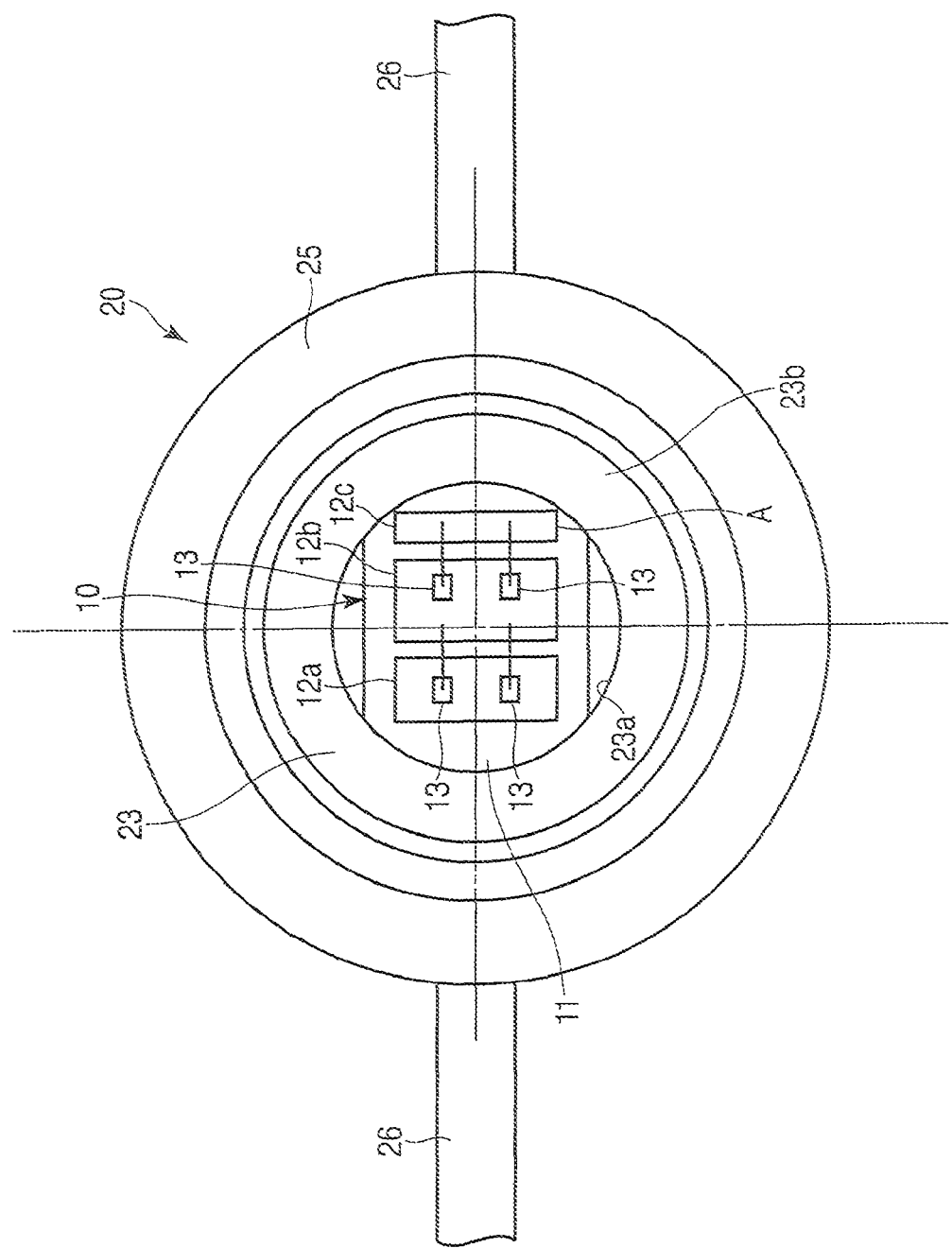
FIG. 2B is a front elevational view of the luminaire shown in FIG. 2A as viewed from the light radiation side.

The light-emitting apparatus 10, which includes the DCB substrate and is formed in a rectangular thin plate, is assembled to a case 21 of a luminaire 20 as shown in FIGS. 2A and 2B. The luminaire 20 is a small down light using the light-emitting apparatus 10 as a light source and configured of the light-emitting apparatus 10 described above, the case 21 to which the light-emitting apparatus 10 is fastened, and a lighting device 22 that turns on the light-emitting apparatus 10.

As shown in FIG. 2A, the case 21 is made of die-cast aluminum and formed in a cylindrical shape having openings on both end portions. The case 21 integrally has a partition wall 21a, which is configured to be attached the light-emitting apparatus 10, inside thereof in a portion lower than a middle portion in FIG. 2A. The partition wall 21a is a support that fastens the light-emitting apparatus 10 to the case 21 and includes a flat surface, which functions as a heat transfer surface, on a lower surface shown in FIG. 2A.

The light-emitting apparatus 10 is tightened to the partition wall 21a with screws inserted into the mounting holes 11C formed at four locations around the insulating base 11 and fastened in a state that the copper reverse metallic component 14 is securely in intimate contact with a flat surface of the aluminum partition wall 21a. Since the substrate 111 of the light-emitting apparatus 10 is not warped, that is, since a gap is not formed between the reverse metallic component 14 and the partition sheet 21a, when the screws are tightened, a crack is not generated in the insulating base 11. Since the reverse metallic component 14 is in intimate contact with the partition sheet 21a, the heat generated by the semiconductor light-emitting elements 13 is efficiently radiated to the partition sheet 21a through the reverse metallic component 14.

In the light-emitting apparatus 10, the obverse metallic component 12 is divided in the longitudinal direction. Accordingly, even if the partition sheet 21a has a bad degree of flatness and the insulating base 11 is fastened in a distorted state, since the insulating base 11 flexibly follows the bad degree of flatness, a crack is unlikely to be occurred and the insulating base 11 is fastened in an intimate contact state.

As shown in FIG. 2A, a reflector 23 is attached to a front surface 11A side of the light-emitting apparatus 10 fastened to the partition wall 21a and surrounds the all semiconductor light-emitting elements 13 as shown in FIG. 2B. The reflector 23 is configured of a white synthetic resin, for example, polybutylene terephthalate (PBT) or the like that has light fastness, heat resistance, and electric insulation property. The reflector 23 integrally forms a circular light incident port 23a having a diameter that surrounds the four semiconductor light-emitting elements 13 mounted on the respective pads 12a, 12b of the light-emitting apparatus 10 and a reflection surface 23b formed in a so-called "mortar-shape" by a rotation paraboloid that surrounds these semiconductor light-emitting elements 13. A light-emitting portion A of the luminaire 20 is configured so that an optical axis x-x of the light-emitting apparatus 10 approximately match with an optical axis y-y of the reflector 23.

The lighting device 22 includes circuit parts that configure a lighting circuit and a power supply circuit necessary to light the four semiconductor light-emitting elements 13 of the light-emitting apparatus 10, transforms an alternating current voltage of 100 volts obtained from a commercial power supply to a direct current voltage of 24 volts, and supplies a constant direct current to the respective semiconductor light-emitting elements 13. The lighting device 22 is accommodated in the case 21. A power supply terminal board 24 that supplies power from the commercial power supply to the lighting device 22 is prepared at an end portion of the case 21 on a side opposite to a light emission side. As shown in FIGS. 2A and 2B, a decoration frame 25 is arranged adjacent to the light-emitting portion A of the case 21 and covered with a transparent cover component 25a. A supporter 26 that holds the case 21 on a ceiling X is configured of a sheet spring.

A set of the down light luminaires 20 is installed on the ceiling X that functions as an installation surface or plural sets of the down light luminaires are installed on the ceiling X by being connected to each other by feed cables. A power supply cable, which is wired to an installation hole H shown by a single-dashed line in FIG. 2A and formed on the ceiling X in a circular shape, is connected to the power supply terminal board 24. After a leading end of the supporter 26 is inserted into the installation hole H together with the case 21 by retracting the supporter 26 inward manually, the supporter 26 is released. Since the supporter 26 is restored by its elasticity and pressed against an inner surface of the installation hole H, the case 21 is held in a state that the decoration frame 25 is abutted against the ceiling X. In the state, a cut end of the installation hole H is covered with the decoration frame 25.

When the luminaire 20 is lit, the light emitted from the respective semiconductor light-emitting elements 13 is reflected on the reflection surface 23b of the reflector 23 and radiated while diffusing downward approximately conically, thereby performing a spot-lighting illumination. At this time, the light radiated from the semiconductor light-emitting elements 13 is reflected by the metals such as nickel, silver, or gold plated on the surfaces of the respective pads 12a, 12b, 12c of the obverse metallic component 12. Further, since the light is reflected also on the surface of the insulating base 11 because the insulating base 11 is configured of white ceramics, the luminaire 20 performs illumination having a small loss.

Further, the obverse metallic component 12 and the reverse metallic component 14 are made of copper excellent in the thermal conductivity, the insulating base 11 is also made of ceramics having the thermal conductivity, and further the case 21 is formed of aluminum excellent in the thermal conductivity. The heat generated by the respective semiconductor light-emitting elements 13 is transferred from the obverse metallic component 12 to the reverse metallic component 14 through the insulating base 11 and further transferred to the case 21 through the heat transfer surface of the partition wall 21a and radiated to the outside of the luminaire 20. That is, the heat is effectively radiated from a side wall of the case 21 having a large surface area to the outside.

Further, the pads 12a, 12b of the obverse metallic component 12, on which the semiconductor light-emitting elements 13 are mounted, are arranged along a longitudinal direction of the insulating base 11. The heat generated by the semiconductor light-emitting elements 13 is more effectively radiated by being transferred along a longitudinal direction of the substrate having a large heat capacity. Further, since the light-emitting apparatus 10 is configured without warping, the light-emitting apparatus 10 is fastened in a state that the reverse metallic component 14 is caused to securely come into intimate contact with the partition wall 21a of the case 21. Since a heat transfer loss from the reverse metallic component 14 to the partition wall 21a is small, the heat is effectively radiated.

The luminaire 20 suppresses a drop of light conversion efficiency of the respective semiconductor light-emitting elements 13 by the radiation operation described above and performs illumination with a high illumination intensity. Further, a life of the semiconductor light-emitting element 13 is also extended.

Since the light-emitting apparatus 10 of the first embodiment is configured to reduce the difference in heat capacities between both sides of the insulating base 11 as much as possible in such a manner that the ratio of volume of the reverse metallic component 14 to the obverse metallic component 12 is set to about 93%, the ceramic insulating base 11 is securely prevented from being warped by heat. At this time, since the difference in thermal expansion rates between both sides of the insulating base 11 is eliminated by making the obverse metallic component 12 and the reverse metallic component 14 of copper that is the same material, the insulating base 11 of the light-emitting apparatus 10 is unlikely to be warped by heat.

Further, warping of the insulating base 11 is controlled by forming the thickness of the reverse metallic component 14 smaller than the thickness of the obverse metallic component 12, that is, by adjusting the thickness and the surface area of the reverse metallic component 14 based on the thickness of the obverse metallic component 12, and setting the ratio of volume of the reverse metallic component 14 to the volume of the obverse metallic component 12 close to 100%. Since the ratio of volume is controlled only by the size change of the simple reverse metallic component 14 that does not have complex wiring patterns and forms the radiation flat sheet, the ratio of volume can be easily adjusted and easily set close to a required ratio of volume, that is, the light-emitting apparatus 10 is excellent in manufacturability.

In the light-emitting apparatus 10, the insulating base 11 is unlikely to be warped even if the insulating base 11 is exposed to a high temperature atmosphere in the manufacturing process, therefore the insulating base 11 is securely prevented from being warped by heat. Further, the light-emitting apparatus 10 is improved so as to be easily handled in the manufacturing process. Since the substrate 111 of the light-emitting apparatus 10 is not warped, a gap is not formed between the reverse metallic component 14 of the substrate and the partition wall 21a. The insulating base 11 is never cracked when the light-emitting apparatus 10 is fastened with screws. Further, since the reverse metallic component 14 is in intimate contact with the partition wall 21a, the heat of the semiconductor light-emitting elements 13 is effectively radiated. Hence, the illumination intensity of the luminaire 20 is increased.

Figure 3A:
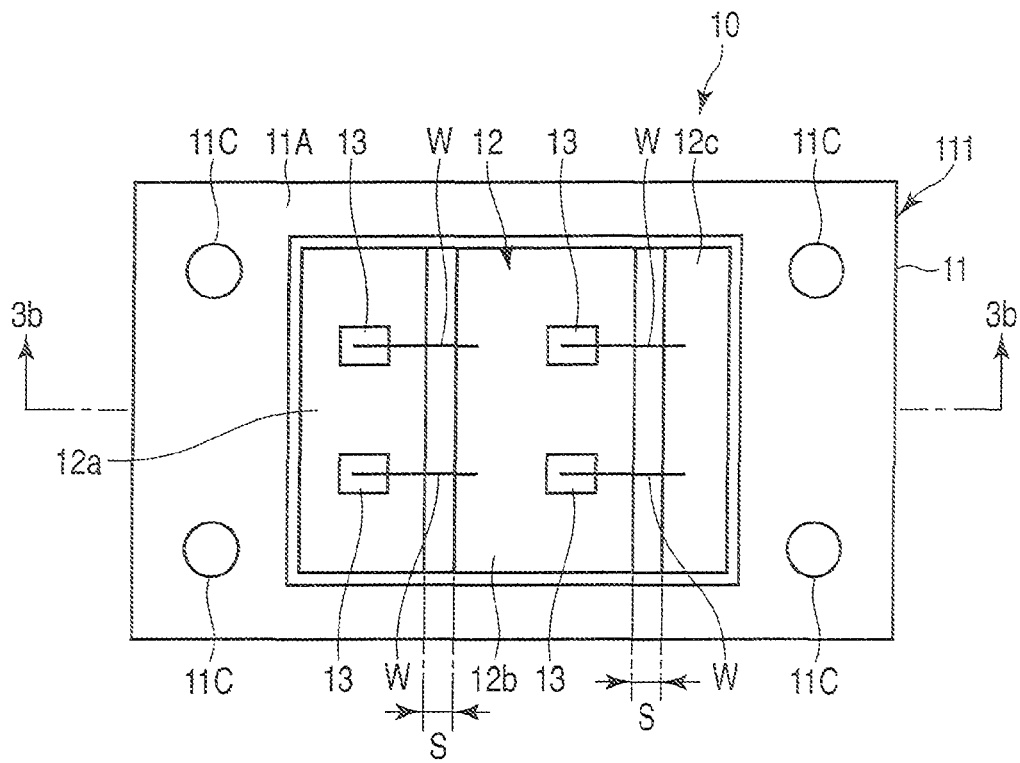
FIG. 3A is a plan view of a light-emitting apparatus of a second embodiment as viewed from the light radiation side.
Figure 3B:
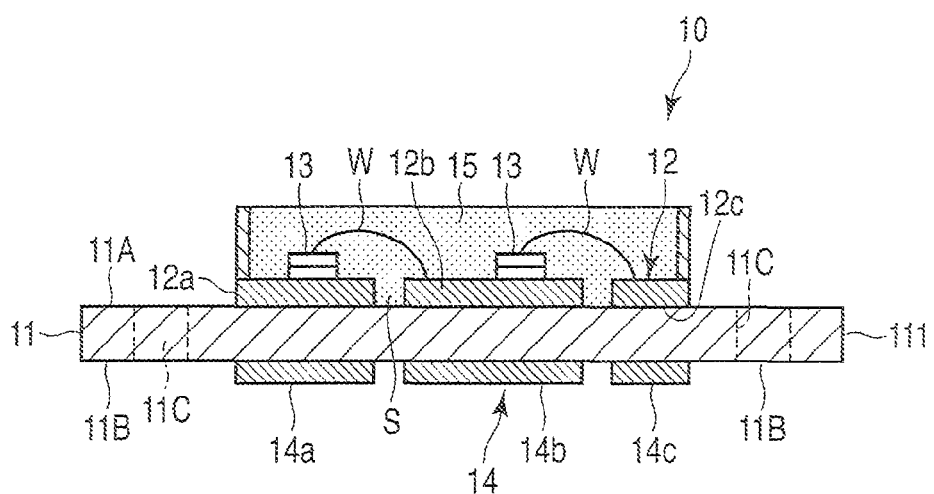
FIG. 3B is a sectional view of the light-emitting apparatus taken along a line 3b-3b in FIG. 3A.

A light-emitting apparatus 10 of a second embodiment will be explained with reference to FIGS. 3A, 3B and 3C. In the respective drawings, configurations that have the same functions as the light-emitting apparatus 10 of the first embodiment are denoted by the same reference numerals as the first embodiment, and the description in the first embodiment is referred to, and explanation is omitted here. In the light-emitting apparatus 10, a reverse metallic component 14 is divided as shown in FIGS. 3B and 3C. That is, as shown in FIGS. 3B and 3C, the reverse metallic component 14 is divided to three locations and arranged on a back surface 11B of a ceramic insulating base 11 and arranged side by side in a longitudinal direction of a substrate 111. As shown in FIGS. 3B and 3C, the reverse metallic component 14 corresponds to patterns of an obverse metallic component 12 disposed on a front surface 11A of the insulating base 11, and respective blocks 14a, 14b, 14c, which configure the reverse metallic component 14, are disposed adjacent to each other in a central region of the insulating base 11 at intervals S along a longitudinal direction and bonded to the insulating base 11 with solder.

The intervals S of the respective blocks 14a, 14b, 14c are arranged avoiding positions that correspond to semiconductor light-emitting elements 13. With the configuration, the heat generated by the semiconductor light-emitting elements 13 is transferred to the blocks 14a, 14b, 14c positioned on an opposite side of the insulating base 11 through short heat transfer paths. Even if the reverse metallic component 14 is divided, a radiation efficiency does not change. Note that when the intervals S are positioned just behind the semiconductor light-emitting elements 13, spaces are formed on back sides of the semiconductor light-emitting elements 13. Therefore, a heat resistance is increased and the radiation efficiency is deteriorated. In particular, if the semiconductor light-emitting elements 13 are combined with the insulating base having a low thermal conductivity, since the heat of the semiconductor light-emitting elements 13 is hard to be diffused by the insulating base, the radiation efficiency is greatly deteriorated.

In the light-emitting apparatus 10, two each of the semiconductor light-emitting elements 13 are mounted on the pads 12a, 12b, respectively, and light-emitting portion A is configured of the four semiconductor Light-emitting elements 13 in total. A light-emitting portion A whose output is increased may be configured by mounting a semiconductor light-emitting element 13 on an obverse metallic component 12 and thus disposing a larger number of semiconductor light-emitting elements 13.

A light-emitting apparatus 10 of a third embodiment will be explained with reference to FIGS. 4A, 4B and 5A. In the respective drawings, configurations that have the same functions as the light-emitting apparatus 10 of the first embodiment are denoted by the same reference numerals as the first embodiment, the description in the first embodiment is referred to, and explanation is omitted here. In the third embodiment, as shown in FIG. 4A, a plurality of pads 12g that function as obverse metallic components are arranged on a front surface 11A of a rectangular ceramic insulating base 11. The pads 12g are arranged in five rows along a longitudinal direction of the insulating base 11 and in four rows in a direction intersecting the longitudinal direction in a total number of twenty pieces in a matrix state at approximately the same intervals and bonded to a front surface 11A of the insulating base 11 with solder. Nickel (Ni) is plated on the respective pads 12g to prevent oxidation as described above. Gold (Au), silver (Ag), or the like may be plated in place of nickel.

As shown in FIG. 4A, the respective pads 12g disposed in matrix are formed in an approximately octagon shape in their entirety with corners 12g1, which are square edge portions when viewed on a plan view, made into round chamfers. As shown in FIGS. 4B and 5A, the pads 12g are formed in an approximately trapezoid in a thickness direction of the insulating base 11, that is, include tapers 12g4 that expand from apex portions 12g2 to bottom portions 12g3, and the bottom portions 12g3 are bonded to a front surface 11A of the ceramic insulating base 11 with solder.

A semiconductor light-emitting element 13 is mounted on an approximately central portion of the apex portions 12g2 of each pad 12g. The light-emitting apparatus 10 of the embodiment includes a rectangular DCB substrate on which the semiconductor light-emitting elements 13 are arranged on the front surface 11A of the insulating base 11 in the matrix state in the total number of twenty pieces. The DCB substrate can form the copper pads 12g, which form wiring patterns, thick. Accordingly, regions 120 in which the pads 12g are not disposed in FIG. 5A become relatively deep grooves. As shown in FIG. 5B, when the regions 120 are grooves having a rectangular cross section, the light radiated from the semiconductor light-emitting elements 13 is partly captured in the grooves.

Figure 5A:
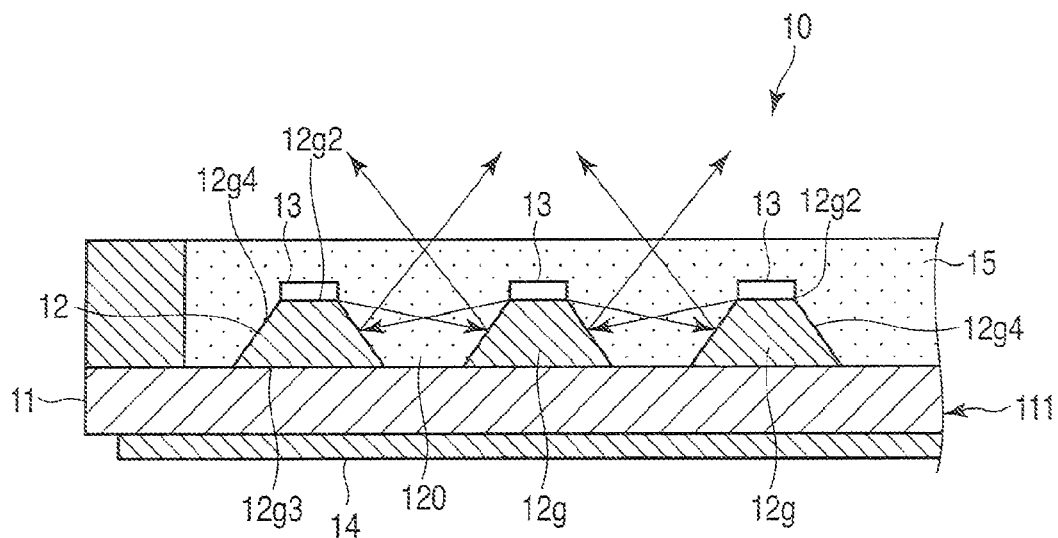
FIG. 5A is a partially cutaway sectional view of the light-emitting apparatus shown in FIG. 4B.
Figure 5B:
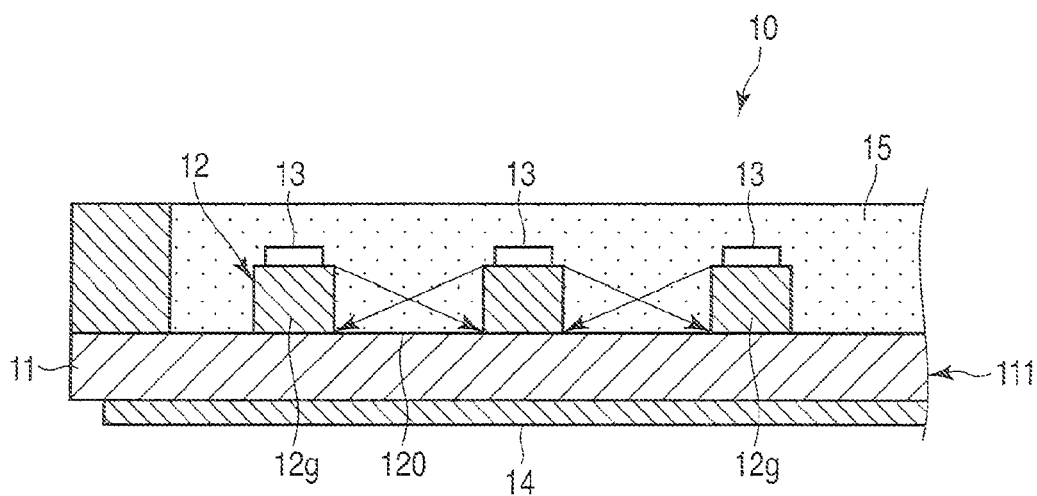
FIG. 5B is a sectional view of a conventional light-emitting apparatus corresponding to FIG. 5A.

In contrast, since the pads 12g of the light-emitting apparatus 10 of the third embodiment have the tapers 12g4 formed around their entire peripheral portions as shown in FIG. 5A, light is partly reflected by the tapers 12g4 in an upward light radiation direction in FIG. 5A as shown by arrows in FIG. 5A. The light radiated from the semiconductor light-emitting elements 13 to the insulating base 11 side is reflected without being captured in the grooves. A light emitting efficiency of the light-emitting apparatus 10 is improved.

Further, since the pads 12g have no acute corners because the corners 12g1 are formed into the round chamfers, an electric field concentration is unlikely to occur. When surfaces of the pads 12g are plated to prevent oxidation, since no angle is formed, a migration phenomenon caused by metals such as nickel and silver is prevented. Since a drop of insulation resistance between the pads 12g is suppressed, the safe light-emitting apparatus 10 is provided. Further, since the corners 12g1 are formed into the round chamfers, a distance between adjacent pads 12g is increased and thus the adjacent pads 12g are electrically insulated from each other securely.

In the light-emitting apparatus 10 of the third embodiment, the copper pads 12g are bonded to the insulating base 11 with solder. The pads 12g may be configured by etching. In this case, since only etching of a thick copper layer, which is a feature of the DCB substrate, forms table mountain-shaped etched surface as shown in FIG. 5A, the tapers 12g4 are automatically formed around the entire peripheral portions of the pads 12g. Light is partly reflected by the tapers 12g4.

A light-emitting apparatus 10 of a fourth embodiment will be explained with reference to FIGS. 6A, 6B, and 6C. In the respective drawings, configurations that have the same functions as the light-emitting apparatus 10 of the first embodiment are denoted by the same reference numerals as the first embodiment, the description, in the first embodiment is referred to, and explanation is omitted here.

In the light-emitting apparatus 10 of the fourth embodiment, a configuration of an obverse metallic component 12 is different from that of the light-emitting apparatus 10 of the first embodiment. The obverse metallic component 12 includes pads 12a, 12b, 12c, strip-shaped portions 12d, reinforcing portions 12e, and power supply portions 12f. Provision of the strip-shaped portions 12d and the reinforcing portions 12e improves strength of the light-emitting apparatus 10 and prevents warping of a substrate 111.

Figure 6A:
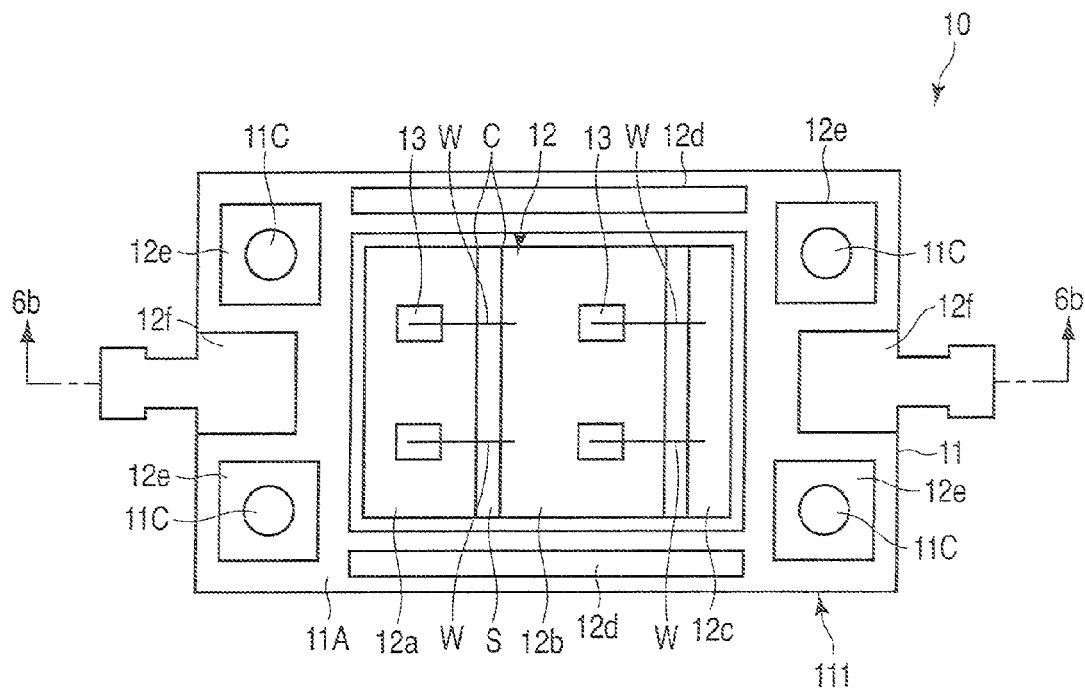
FIG. 6A is a plan view of a light-emitting apparatus of a fourth embodiment as viewed from the light radiation side.

As shown in FIG. 6A, in the light-emitting apparatus 10 of the fourth embodiment, a part of the copper obverse metallic component 12 is disposed in a peripheral portion of an insulating base 11 as the strip-shaped portions 12d. The strip-shaped portions 12d are located near sides with which the pads 12a, 12b, 12c commonly confront, respectively, that is, at a position near an upper edge and a position near a lower edge of the insulating base 11 in FIG. 6A in a length across the respective pads 12a, 12b, 12c and along a longitudinal direction of the insulating base 11. The strip-shaped portions 12d are disposed so as to have the same intervals as electric insulation intervals S disposed between the respective pads 12a, 12b and bonded to a front surface 11A of the insulating base 11 with solder. Nickel (Ni) and the like are plated also on surfaces of the respective strip-shaped portions 12d to prevent oxidation.

Since the strip-shaped portions 12d are disposed in a peripheral portion of the insulating base 11, the strip-shaped portions 12d work as described below. Since the strip-shaped portions 12d are disposed along the longitudinal direction of the insulating base 11, the strip-shaped portions 12d reduce warping of the substrate itself. Further, edge portions of the pads 12a, 12b of the obverse metallic component 12, that is, on edge portions C shown by arrows in FIGS. 6A and 6B is easily cracked by stress which is concentrated to the edge portions because of an influence of warping on a case side, a degree of surface flatness, or the like when the ceramic insulating base 11 is tightened and fastened to a case 21 and the like with screw.

Figure 6B:
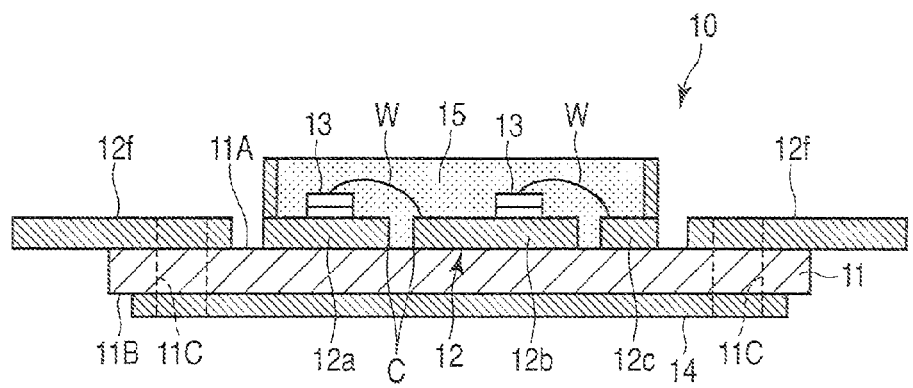
FIG. 6B is a sectional view of the light-emitting apparatus taken along a line 6b-6b in FIG. 6A.

According to the embodiment, since provision of the strip-shaped portions 12d that function as reinforcing frames disperses local stress concentrated on the edge portions C in FIGS. 6A and 6B, a crack is unlikely to be generated in the edge portions C of the pads 12a, 12b.

Further, since the strip-shaped portions 12d word as the reinforcing frames around the substrate 111 that has a relatively weak strength, in particular, in a peripheral portion of the substrate, a crack can be prevented from being generated in the peripheral portion. Further, the strip-shaped portions 12d are placed making use of a dead space on the insulating base 11. It is not necessary to increase a size of the substrate to install the reinforcing frames.

Further, in the embodiment, reinforcing portions 12e included in a part of the obverse metallic component 12 are formed around screw tightening mounting holes 11C. That is, the reinforcing portions 12e are arranged between the other adjacent pads 12a, 12b, 12c so as to have electric insulation intervals and so as to surround the peripheries of the respective four screw tightening mounting holes 11C formed at four corners of the insulating base 11 and bonded to the front surface 11A of the insulating base 11 with solder. Nickel (Ni) and the like are plated also on surfaces of the respective reinforcing portions 12e to prevent oxidation.

Since the reinforcing portions 12e are arranged to surround the peripheries of the mounting holes 11C, the reinforcing portions 12e work as described below. That is, the reinforcing portions 12e disperse stress so that the stress is not locally concentrated on screw tightening portions when the insulating base 11 is fastened to the case and the like with screw. Since the reinforcing portions 12e formed in the peripheries of the mounting holes 11C play a role of the reinforcing frames and disperse the stress locally applied to the mounting holes 11C, the reinforcing portions 12e prevent clacking in the screw tightening portions and the peripheries thereof.

The light-emitting apparatus 10 of the fourth embodiment includes the power supply portions 12f that configure a pair of terminal portions on the front surface 11A of the insulating base 11. The power supply portions 12f, which form the approximately square terminal portions, are arranged in a short side of the rectangular ceramic insulating base 11 with electric insulation intervals formed between the adjacent pads 12a, 12b, the strip-shaped portions 12d, and the reinforcing portions 12e and are bonded to the front surface of the insulating base 11 with solder. Nickel (Ni) and the like are plated also on surfaces of the respective power supply portions 12f to prevent oxidation like the other portions of the obverse metallic component 12.

The strip-shaped portions 12d, which form the reinforcing frames of the peripheral portion of the substrate 111, the reinforcing portions 12e, which form the reinforcing frames of the mounting holes 11C, and the power supply portions 12f, which configure the terminal portions, are configured of a copper having a sheet thickness of about 0.25 mm as same as the pads 12a, 12b that mount the semiconductor light-emitting elements 13. Further, the power supply portions 12f are bonded to the front surface 11A of the insulating base 11 with solder at the same time as the pads 12a, 12b.

Metals such as nickel, silver, or gold are plated on the obverse metallic component 12 so as to cover its surface as same as the pads 12a, 12b. A light emitting efficiency is improved by reflecting the light, radiated from the semiconductor light-emitting elements 13 to the insulating base 11 side, to a light radiation side. Since the insulating base 11 is reinforced by the strip-shaped portions 12d and the reinforcing portions 12e included in the obverse metallic component 12, a sheet thickness of the insulating base 11 is reduced. The heat of the semiconductor light-emitting elements 13 is efficiently transferred to the reverse metallic component 14.

Since the light-emitting apparatus 10 of the fourth embodiment configures the obverse metallic component 12 which includes the strip-shaped portions 12d and the reinforcing portions 12e that function as the reinforcing frames, the peripheral portion of the substrate 111 and the peripheries of the mounting holes are reinforced. Cracking in the insulating base 11 is prevented, and a ratio of volume of the reverse metallic component 14 to the obverse metallic component 12 is easily adjusted to 50% or more by making use of the reinforcing frames. The light-emitting apparatus 10 prevents warping of the substrate 111 itself by a simple structure and method.

Since an increase of area of the obverse metallic component 12 sets the ratio of volume of the reverse metallic component 14 to the obverse metallic component 12 close to one, it is easy to prevent warping of the insulating base 11 caused by a volume difference. When a ratio of volume of the obverse metallic component 12 is smaller than that of the reverse metallic component 14 in a configuration in which the reinforcing frames and the like are not disposed, it is effective to additionally provide the strip-shaped portions 12d and the reinforcing portions 12e. When a volume of the obverse metallic component 12 is larger than that of the reverse metallic component 14 in the configuration in which the reinforcing frames and the like are not disposed, a total volume of the obverse metallic component 12 becomes excessively large when the strip-shaped portions 12d and the reinforcing portions 12e are added. In this case, it is only necessary to increase a thickness and a laying region of the reverse metallic component 14. When the laying region of the reverse metallic component 14 is increased, a radiation effect of the insulating base is increased.

Figure 6C:
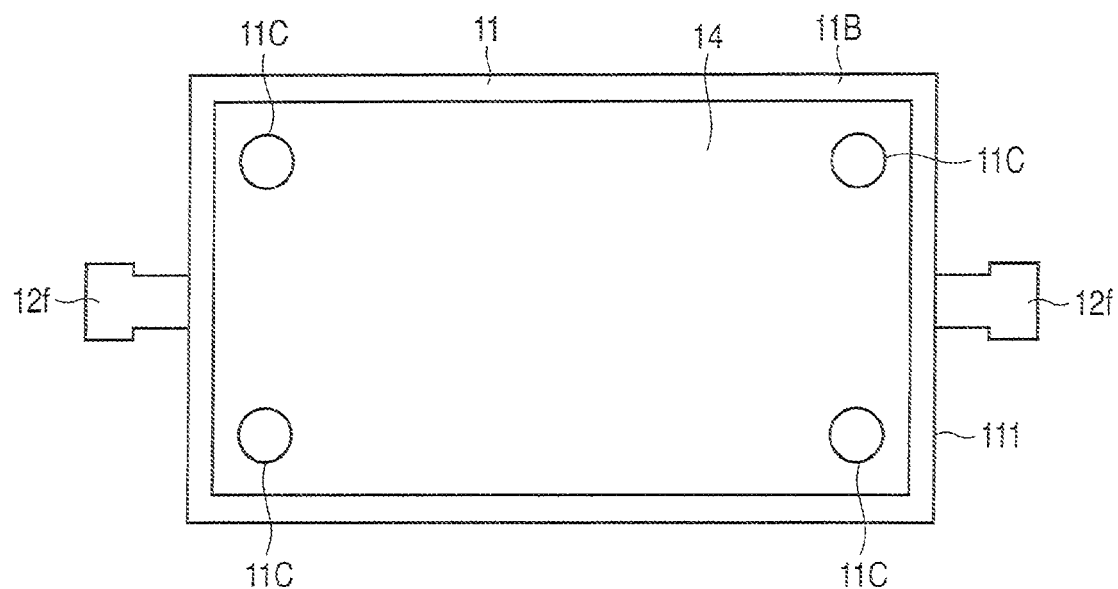
FIG. 6C is a back surface view of the light-emitting apparatus shown in FIG. 6A.

The light-emitting apparatus 10 of the fourth embodiment includes the power supply portions 12f that configure the terminal portions and also increases an area of the reverse metallic component 14 as shown in FIG. 6C. A sheet thickness of the reverse metallic component 14 is about 0.2 mm as in the first embodiment. The ratio of volume of the reverse metallic component 14 to the obverse metallic component 12 is about 95% and close to 100%. In the light-emitting apparatus 10, since a heat capacity difference between both the surfaces of the insulating base 11 is reduced, warping occurred in the insulating base 11 by heat can be easily prevented. Since the strip-shaped components 12d are disposed in the light-emitting apparatus 10 of the fourth embodiment along the longitudinal direction of the insulating base 11, warping of the substrate 111 becomes small.

The light-emitting apparatuses 10 of the second to fourth embodiments are employed as the light-emitting apparatus 10 of the luminaire 20 shown in FIGS. 2A and 2B.

A luminaire 100 including a light-emitting apparatus 10 of a fifth embodiment will be explained with reference to FIGS. 7 to 16. The luminaire 100 shown in FIGS. 7 to 10 is a spotlight including two sets of the light-emitting apparatuses 10. The luminaire 100 includes the two light-emitting apparatuses 10, a settled-component 3, and a concave reflection mirror 4, and a mirror support component 5. Each of the light-emitting apparatuses 10 is of a chip on board (COB) type and includes a substrate 111, plurality of LED chips 131, which function as semiconductor light-emitting elements, a frame component 16, a translucent seal component 18, and the like as shown in FIGS. 11 to 14.

Figure 11:
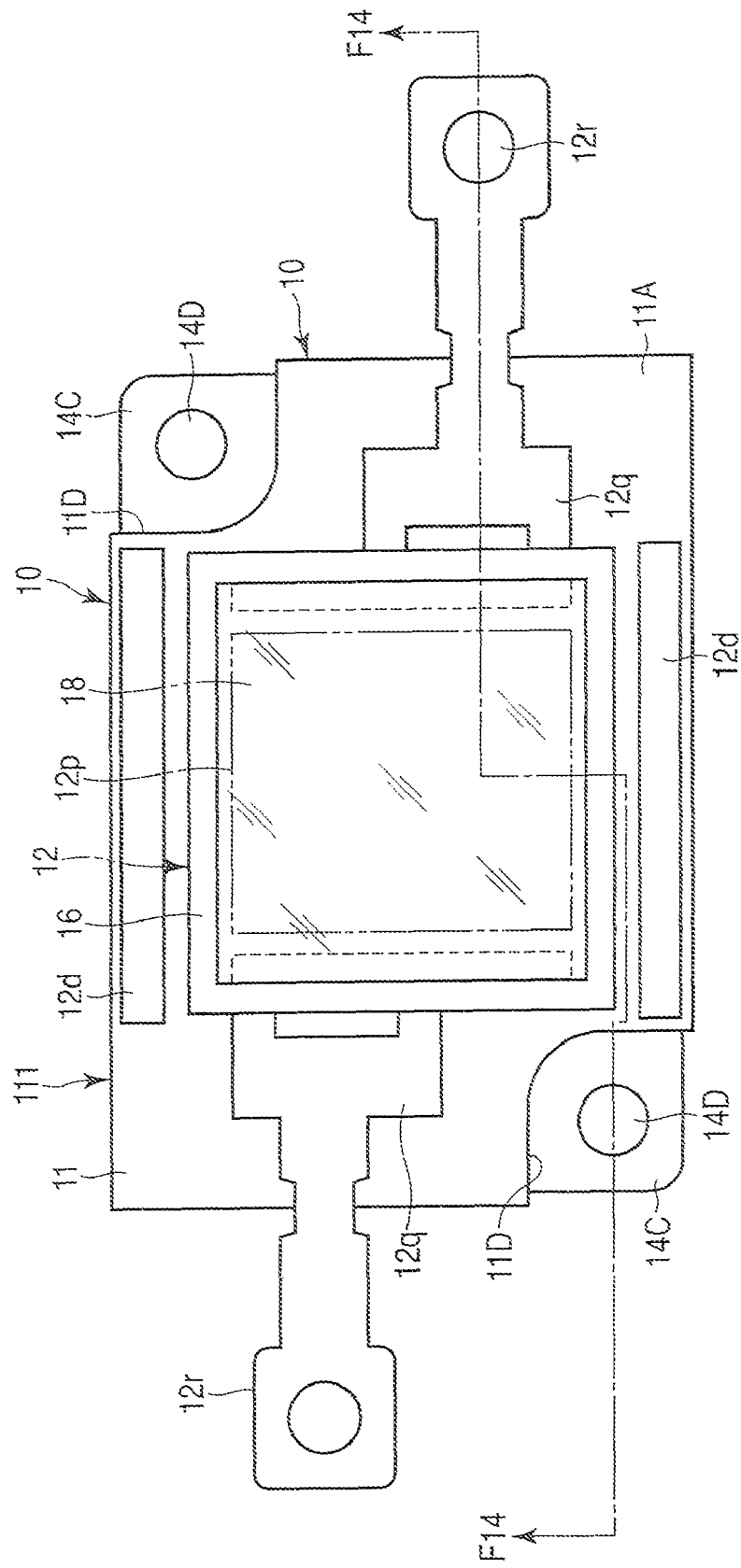
FIG. 11 is a front elevational view of the light-emitting apparatus shown in FIG. 7 as viewed from the light radiation side.

The substrate 111 is a DCB substrate and includes an insulating base 11, an obverse metallic component 12, and a reverse metallic component 14 as shown in FIG. 14. The insulating base 11 is a flat ceramic sheet composed of $Al_2O_3$, AlN, SiN, and the like. As shown in FIGS. 11 and 13, the sheet-shaped insulating base 11 includes recess portions 11D around a peripheral portion, for example, in two of the four corners. A pair of the recess portions 11D is formed by cutting out positions of opposite corners of the insulating base 11 and opened to a peripheral surface and in a thickness direction of the insulating base 11, respectively. As shown in FIG. 11, a mounting surface 11A on which the LED chips 131 are mounted is defined as a front surface of the insulating base 11 and a surface opposite to the mounting surface 11A is defined as a back surface 11B of the insulating base 11. The mounting surface 11A and the back surface 11B of the insulating base 11 are parallel to each other.

The obverse metallic component 12 is formed on the front surface 11A side of the insulating base 11. The obverse metallic component 12 includes pads 12p and power supply portions 12q. The pad 12p and the power supply portion 12q are directly bonded to the mounting surface 11A of the insulating base 11 by a DCB method. The obverse metallic component 12 radiates the heat of the LED chips 131 and reflects the light emitted by the LED chips 131. The reverse metallic component 14 is disposed on the back surface 11B side of the insulating base 11 and directly bonded thereto by the DCB method. Each of the obverse metallic component 12 and the reverse metallic component 14 is made of copper.

In the direct bonding by the DCB method, each of the copper obverse metallic component 12 and the copper reverse metallic component 14 has a surface on which a copper oxide film is formed, and the copper oxide film is faced the insulating base 11 made of ceramics. An eutectic molten material is formed on a bond interface between the copper obverse metallic component 12 and the copper reverse metallic component 14 and the ceramic insulating base 11 by heating them at a temperature lower than a melting temperature of copper and higher than a melting temperature of the copper oxide film, by a heating furnace. The obverse metallic component 12 and the reverse metallic component 14 are bonded to the mounting surface 11A or to the back surface 11B of the insulating base 11 by the eutectic molten material.

The obverse metallic component 12, which is directly bonded to the mounting surface 11A, is configured of the pads 12p divided in a matrix state. As shown in FIG. 15, the respective pads 12p are arranged squarely at the same gaps in the matrix state corresponding to the disposition of the LED chips 131.

The power supply portions 12q are disposed on both the sides of a region of the pads 12p arranged in FIG. 15 away therefrom with predetermined gaps. The power supply portions 12q in a range, which overlaps the mounting surface 11A, are directly bonded to the mounting surface 11A. Free end portions of the respective power supply portions 12q, which extend straightly along the mounting surface 11A of the insulating base 11 to the outside, are used as power supply terminals 12r. As shown in FIG. 14, the power supply terminals 12r extend in parallel with the mounting surface 11A in a thickness direction of the insulating base 11 without changing their positions. The power supply terminals 12r may be formed in a crank shape so as to be bent in the thickness direction of the insulating base 11 away from the mounting surface 11A and further bent in a direction parallel with the mounting surface 11A ahead of the above bent position.

The power supply portions 12q are formed symmetrically about a point with respect to a center of the insulating base 11, and the power supply terminals 12r of the power supply portions 12q are disposed offset with respect to recess portions 11D of the insulating base 11 as shown in FIGS. 11 and 13. The power supply portions 12q are connected to power supply insulation covered wires (not shown).

The light-emitting apparatus 10 of the fifth embodiment includes LED series circuits in each of which the LED chips 131 are connected in series and which are arranged in parallel. The light-emitting apparatus 10 shown in FIG. 15 connects the five LED series circuits, in each of which the seven LED chips 131 are connected in series, to the power supply portions 12q. A pair of the power supply portions 12q that supply power to the respective LED series circuits is arranged on both the outsides of the region of the pads 12p. All the LED chips 131 may be connected in series and supplied with power. In this case, the power supply portions 12q are arranged adjacent to the pads 12p on both the ends of the series circuits.

Surfaces of the pads 12p and the power supply portions 12q which are the obverse metallic component 12 are laminated with metal layers which are greatly thinner than the obverse metallic component 12. Each of the metal layers is configured of a base plating layer plated on a surface of the obverse metallic component 12 in a thickness of about 3 μm and a surface plating layer plated to an outside of the base plating layer in a thickness of about 0.3 μm. The base plating layer is a nickel plating layer, and the surface plating layer is a plating layer of any of copper (Cu), silver (Ag), and gold (Au). When the surface plating layer is formed of a silver plating layer, a light reflection amount in the respective pads 12p that form the obverse metallic component 12 is increased in comparison with a case in which the plating layer is not formed.

The pads 12p and the power supply portions 12q of the obverse metallic component 12 are formed in a determined pattern on the front surface of the mounting surface 11A of the insulating base 11 by the following procedure. First, a metal sheet, a copper sheet in the fifth embodiment, having a uniform thickness or is punched to a predetermined pattern by a dies of a press machine. The punched copper sheet is directly bonded to the mounting surface 11A by interface bonding such as eutectic bonding and diffusion bonding. After the copper sheet is subjected to a plating treatment, bridge portions, which connect the pads 12p and the power supply portions 12q of the copper sheet bonded to the mounting surface 11A, are cut off and removed. With the operation, the independent pads 12p and power supply portions 12q are formed.

The pads 12p and the power supply portions 12q may be formed by other method. That is, after a copper sheet formed in a predetermined thickness and size is directly bonded to the mounting surface 11A of the insulating base 11, the copper sheet is etched to remove unnecessary portions and to have a desired pattern. Remaining necessary portions, that is, the pads 12p and the power supply portions 12q of the obverse metallic component 12 are subjected to a plating treatment thereafter.

The reverse metallic component 14 is directly bonded to the back surface 11B of the insulating base 11 by the DCB method. The reverse metallic component 14 is formed to prevent warping of the substrate 111 in a manufacturing process and to radiate heat. The reverse metallic component 14 covers an approximately entire region of the back surface 11B of the insulating base 11 as shown in FIG. 12. The reverse metallic component 14 is flat and includes fastening portions 14C at two locations in the fifth embodiment integrally therewith as shown in FIGS. 11 to 13.

The fastening portions 14C project beyond a peripheral portion of the insulating base 11 to the recess portions 11D of the insulating base 11 along the back surface 11B. The fastening portions 14C include screw-passing holes 14D. Slots that are cut out as the fastening portions may be used in place of screw-passing holes 14D.

Thicknesses of the pads 12p and the power supply portions 12q of the obverse metallic component 12 and a thickness of the reverse metallic component 14, which are directly bonded to the insulating base 11 as sheet metal materials, are selected in a range of 200 μm to 500 μm so that the pads 12p, the power supply portions 12q and the reverse metallic component 14 have target thickness when they are directly bonded to the insulating base 11. Since the obverse metallic component 12 and the reverse metallic component 14 are greatly thicker than the metal plating layers, the obverse metallic component 12 and the reverse metallic component 14 have a mechanical strength.

The thickness of the reverse metallic component 14 is thinner than the thickness of the power supply portions 12q of the obverse metallic component 12. When the substrate 111 is manufactured by the DCB method, if a temperature of the substrates 111 rises due to the direct bond and then drops to a room temperature, there is a tendency that the obverse metallic component 12 side becomes convex and the reverse metallic component 14 side becomes concave. The thickness of the reverse metallic component 14 is determined according to a pattern of the obverse metallic component 12 to suppress warping of the substrate 111.

The respective LED chips 131 may use semiconductor light-emitting elements that have various types of emission color. In the fifth embodiment, LED chips that emit blue light are employed. The LED chips 131 are semiconductor bare chips, each of which is configured by layering an element substrate 131a, semiconductor emission layer 131b, and an element electrode 131c as shown in FIG. 14. The element substrate 131a is made of an insulation material such as sapphire. The semiconductor emission layer 131b is laminated on the element substrate 131a and emit monochromatic blue light. The element electrode 131c is configured of a pair of a positive electrode and a negative electrode is formed on the semiconductor emission layer 131b.

Since the LED chips 131 are mounted on the mounting surface 11A side of the insulating base 11, a surface of the element substrate 131a on an opposite side on which the semiconductor emission layer 131b is laminated is fastened to each pad 12p by a die-bonding material 17. The die-bonding material 17 is a silver paste or a resin adhesive such as a transparent silicone resin.

The respective LED chips 131 are mounted in an atmosphere heated to about 300° C. In this case, warping of the substrate 111 is controlled by adjusting a difference between an area occupied by the pads 12p and the power supply portions 12q of the obverse metallic component 12 in the mounting surface 11A of the insulating base 11 and an area occupied by the reverse metallic component 14 in the back surface 11B of the insulating base 11. That is, the warping of the insulating base 11 is suppressed based on a volume difference converted based on respective areas and thicknesses of the obverse metallic component 12 bonded to the front surface of the insulating base 11 and the reverse metallic component 14 bonded to the back surface 11B. Since the obverse metallic component 12 is formed into a pattern configured by the pads 12p and the power supply portions 12q, the obverse metallic component 12 has an area smaller than that of the reverse metallic component 14. When the obverse metallic component 12 and the reverse metallic component 14 have the same thickness, it is predicted that the substrate 111 is warped so that the mounting surface 11A side of the insulating base 11 becomes convex and the back surface 11B side thereof becomes concave. Thus, the thickness of the reverse metallic component 14 is made thinner than the thickness of the obverse metallic component 12.

When the thickness of the reverse metallic component 14 is not adjusted to the obverse metallic component 12, unallowable warping may be generated in the substrate 111 before a process in which the LED chips 131 are mounted. When warping is generated in the substrate 111, it is difficult to appropriately manage a thickness of the die-bonding material 17. When the thickness of the die-bonding material 17 is uneven, the LED chips 131 may be defectively mounted. When the LED chips 131 are insufficiently mounted, capability of radiating the heat generated while the LED chips 131 are lit to the pads 12p through the die-bonding material 17 is lowered. Thus, a light emission performance of the LED chips 131 is deteriorated and a life of the LED chips 131 is also reduced.

When warping is happened while the LED chips 131 are lit, a central portion of the substrate 111, which should be in intimate contact with a radiation component, may be away from the radiation component. A heat transfer function of a portion exfoliated from the radiation component is lowered, and a so-called heat spot is formed. An emission performance of the LED chips 131 in a portion in which the heat spot is formed is deteriorated and a life is reduced. The light-emitting apparatus 10 of the fifth embodiment suppresses warping of the substrate 111 small before the LED chips 131 are mounted on the substrate 111 and while the LED chips 131 are lit by making the thickness of the reverse metallic component 14 smaller than the thicknesses of the pads 12p and the power supply portions 12q of the obverse metallic component 12. Since a disadvantage that the substrate 111 of the light-emitting apparatus 10 is warped more than an allowable amount is alleviated, quality of the light-emitting apparatus 10 is improved.

Since a luminaire 100 includes the light-emitting apparatuses 10 in each of which the thickness of the reverse metallic component 14 is smaller than the thicknesses of the pads 12p and the power supply portions 12q of the obverse metallic component 12, occurrence of warping, in which the mounting surface 11A side of the insulating base 11 becomes convex and the back surface 11B side thereof becomes concave due to a volume ratio of the metal components formed on the front surface and the back surface of the insulating base 11, can be suppressed while the luminaire 100 is lit. Further, since the central portion of the substrate 111 is unlikely to be exfoliated from the radiation component by suppressing occurrence of warping in the substrate 111, the heat spot is not formed in the substrate 111.

As shown in FIGS. 14 and 15, the element electrodes 131c of the respective LED chips 131 are electrically connected to the pads 12p and the power supply portions 12q by bonding wires W. In this case, the element electrodes 131c of one electrode are connected to the pads 12p on which the LED chips 131 are mounted by bonding wires W, and the element electrodes 131c of the other electrode are connected to other pads 12p adjacent to the pads 12p on which the LED chips 131 are mounted by bonding wires W. The LED chips 131, which are connected through the bonding wires W and the pads 12p, are connected to each other in series.

An element electrode 131c of an LED chip 131, positioned at an end of a train of the LED chips connected in series, is connected to a power supply portion 12q adjacent to a pad 12p on which the LED chip 131 is mounted by a bonding wire W, and a pad 12p, on which an LED chip 131 positioned at the other end of the train of the LED chips is mounted, is connected to the other power supply portion 12q by a bonding wire W. Trains of LED chips are connected in parallel between power supply portions 12q positioned on both sides in a direction where the trains extend.

As shown in FIGS. 11 and 14, the light-emitting apparatus 10 includes a frame component 16 arranged partially surrounding the pads 12p and the power supply portions 12q. The frame component 16 has a height enough to accommodate the respective LED chips 131 mounted on the pads 12p and the bonding wires W that connect the respective LED chips 131 therein and is adhered on the mounting surface 11A of the substrate 111.

The LED chips 131 and the bonding wires W are buried by the seal component 18 filled in an inside surrounded by the frame component 16. The seal component 18 is made of a transparent resin or a transparent silicone resin in the fifth embodiment and contains a fluorescent material therein. The fluorescent material radiates specific color light when the fluorescent material is excited by a part of blue light radiated by the LED chips 131. In the fifth embodiment, with respect to the blue light radiated by the LED chips 131, a yellow fluorescent material that excites and radiates yellow light, a red fluorescent material that excites and radiates red light, or a green fluorescent material that excites and radiates green light is blended with the seal component 18 at a preset blend rate.

Figure 9:
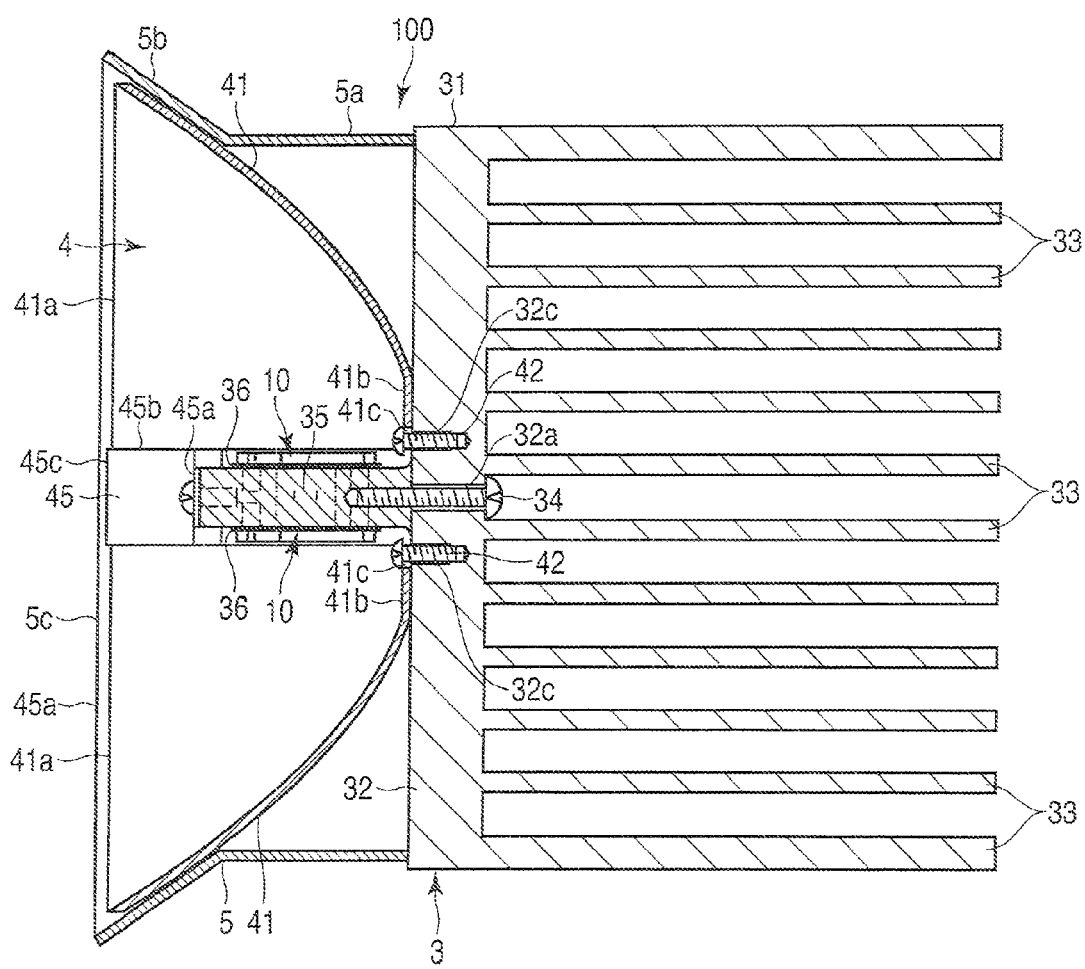
FIG. 9 is a sectional view of the luminaire shown in FIG. 7.
Figure 10:
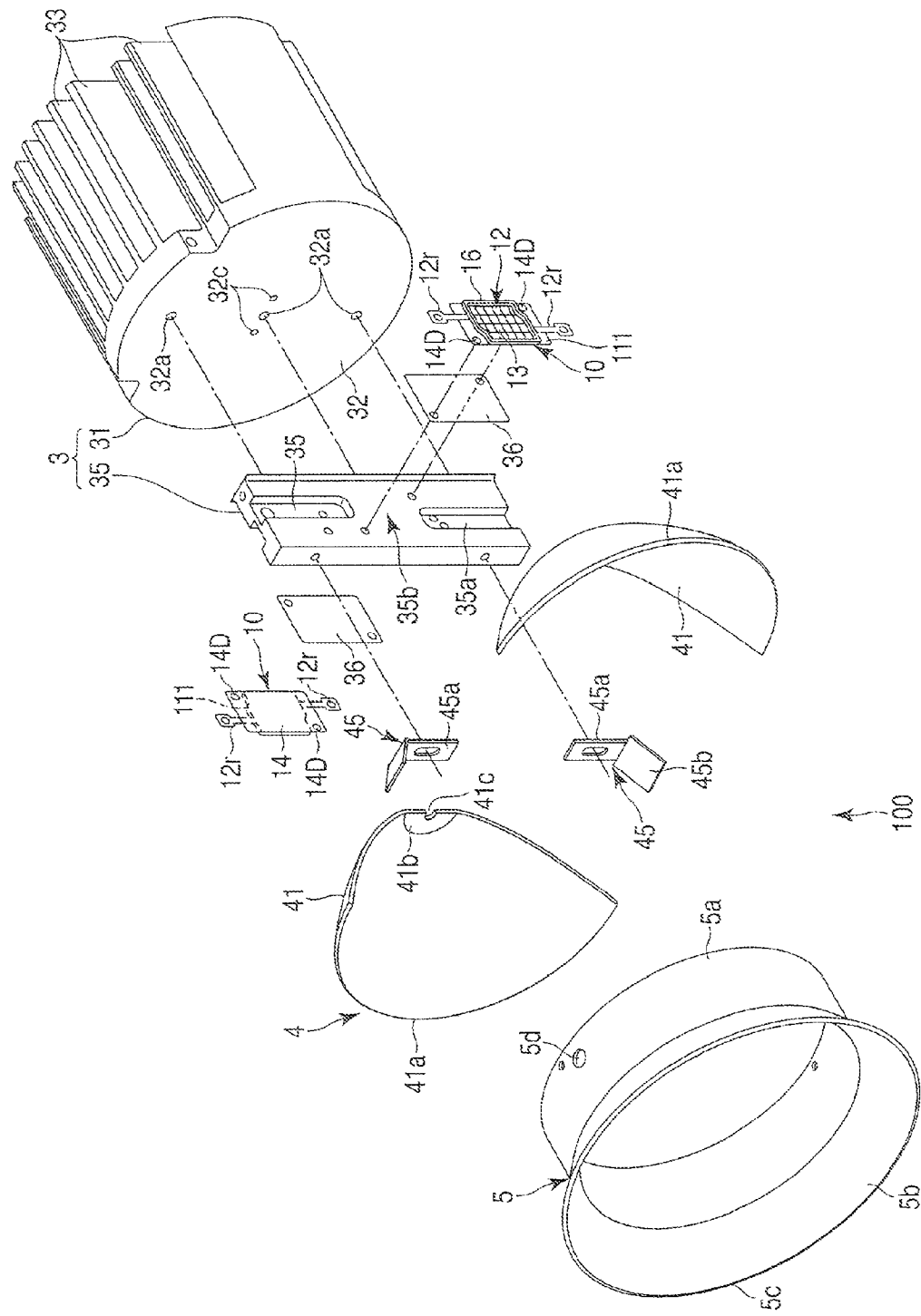
FIG. 10 is an exploded perspective of the luminaire shown in FIG. 7.

The light-emitting apparatuses 10 configured as described above are attached to the settled-component 3 of the luminaire 100 as shown in FIG. 9. As shown in FIGS. 9 and 10, the settled-component 3 includes a heat sink 31 and a heat receiving portion 35 these form a case. The settled-component 3 may be a metal case when the settled-component 3 is applied to other than the luminaire 100 shown in FIG. 7. In the luminaire 100, a side to which illumination light is radiated is defined as "front side" or "forward" and a side opposite to the above side is defined as "back side" or "rear".

The heat sink 31 is diecast with aluminum and includes a plurality of radiator fins 33 perpendicularly formed to a back surface of an approximately disc-shaped base 32 integrally therewith as shown in FIGS. 9 and 10. The respective radiator fins 33 are parallel with each other.

The heat receiving portion 35 is a rectangular parallelepiped having a thickness approximately the same as a thickness of the base 32. The heat receiving portion 35 is configured separately from the heat sink 31 and attached to a front surface of the base 32 on a side opposite to the radiator fins 33. As shown in FIG. 9, the heat receiving portion 35 is caused to come into contact with the front surface of the base 32 and coupled with the heat sink 31 with coupling fasteners 34 such as screws inserted thereinto from the radiator fins 33 side. The heat receiving portion 35 may be molded integrally with the base 32.

The heat receiving portion 35 fastened to the base 32 extends in a radial direction of the base 32 passing through a center of the base 32 and is arranged in parallel with the radiator fins 33. As shown in FIG. 10, the base 32 includes coupling holes 32a, into which the coupling fasteners 34 are inserted, corresponding to a position to which the heat receiving portion 35 is attached.

The light-emitting apparatuses 10 are fastened to the heat receiving portion 35 which has heat receiving surfaces 35b arranged vertically to the front surface of the base 32. The light-emitting apparatuses 10 are fastened by facing the reverse metallic components 14 to the heat receiving surfaces 35b and inserting heat transfer sheets 36 between the reverse metallic components 14 and the heat receiving surfaces 35b as shown in FIG. 10. The light-emitting apparatuses 10 are fastened with screws which are attached to the heat receiving portion 35 through the screw-passing holes 14D of the fastening portions 14C.

As shown in FIG. 10, the heat receiving portion 35 includes escape grooves 35a formed in the heat receiving surfaces 35b. The power supply terminals 12r are arranged at positions corresponding to the escape grooves 35a. Insulation covered wires connected to the power supply terminals 12r are wired to the escape grooves 35a. The heat transfer sheets 36 are made of a soft silicone resin excellent in a thermal conductivity. Even if the substrates 111 are warped a little by a temperature change, the heat transfer sheets 36 are made flat so as to be in contact with both the heat receiving surfaces 35b and the reverse metallic components 14 of the substrates 111 without gaps therebetween. Since the heat transfer sheets 36 are inserted, the heat generated by the light-emitting apparatuses 10 is transferred from the reverse metallic components 14 to the heat receiving surfaces 35b with a small amount of transfer loss.

Since the substrates 111 of the light-emitting apparatuses 10 fastened to the heat receiving portion 35 of the settled-component 3 with screw are the DCB substrates and include the reverse metallic components 14 directly bonded to back surfaces of the ceramic insulating bases 11. A copper sheet having a thickness of 200 μm to 500 μm is used as the reverse metallic components 14. The fastening portions 14C, which are formed integrally with the reverse metallic components 14, have a strength sufficient to fasten the substrates 111 to the heat receiving portion 35 with screw. The fastening portions 14C are parts of the reverse metallic components 14 extending externally beyond peripheral portions of the insulating bases 11. That is, the substrates 111 of the light-emitting apparatuses 10 can be attached to the heat receiving portion 35 by fitting the screws to the screw-passing holes 14D of the fastening portions 14C without passing the screws through the ceramic insulating bases 11.

The fastening portions 14C, in which the screw-passing holes 14D are formed as screw-passing portions, are integrated with the reverse metallic components 14 of the substrates 111 that function as the DCB substrates. Accordingly, the substrates 111 is fastened with screw without increasing the number of parts. Further, since the screws, which fasten the substrates 111 of the light-emitting apparatuses 10 to the heat receiving portion 35 are not passed through the ceramic insulating bases 11, even if screw tightening torque is somewhat excessive, the insulating bases 11 are not easily broken.

As shown in FIGS. 7 to 10, the concave reflection mirror 4 is configured of a pair of concave mirror components 41 made of aluminum. As shown in FIG. 9, a reflection surface of each concave mirror component 41 is formed in a parabolic shape and mirror finished. As shown in FIG. 10, the concave mirror components 41 include semi-arc-shaped edges 41a positioned on a light outgoing side and seat portions 41b positioned on the base 32 side of the heat sink 31. The seat portions 41b are formed flat along the base 32 and include cutouts 41c. As shown in FIG. 9, the concave mirror components 41 cause the seat portions 41b to come into contact with the front surface of the base 32 of the heat sink 31 and are fastened to the base 32 by screws 42 fitted to fastening holes 32c of the base 32 so as to be hooked to the cutouts 41c. The screws 42 that fasten the concave mirror components 41 to the base 32 are fitted to the fastening holes 32c before the heat receiving portion 35 is attached to the base 32.

The pair of concave mirror components 41 fastened to a front surface side of the heat sink 31 faces the light-emitting apparatuses 10 on both the sides of the heat receiving portion 35 and arranged in plane symmetry across the heat receiving portion 35. The seal components 18, which are blended with the fluorescent material and function as light-emitting portions of the light-emitting apparatuses 10, face reflecting surfaces configured of parabolic surfaces of the concave mirror components 41. The light-emitting apparatuses 10 are arranged so that center portions P of the light-emitting portions of the light-emitting apparatuses 10 shown in FIG. 15 are positioned at a focus of the concave mirror components 41.

Figure 7:
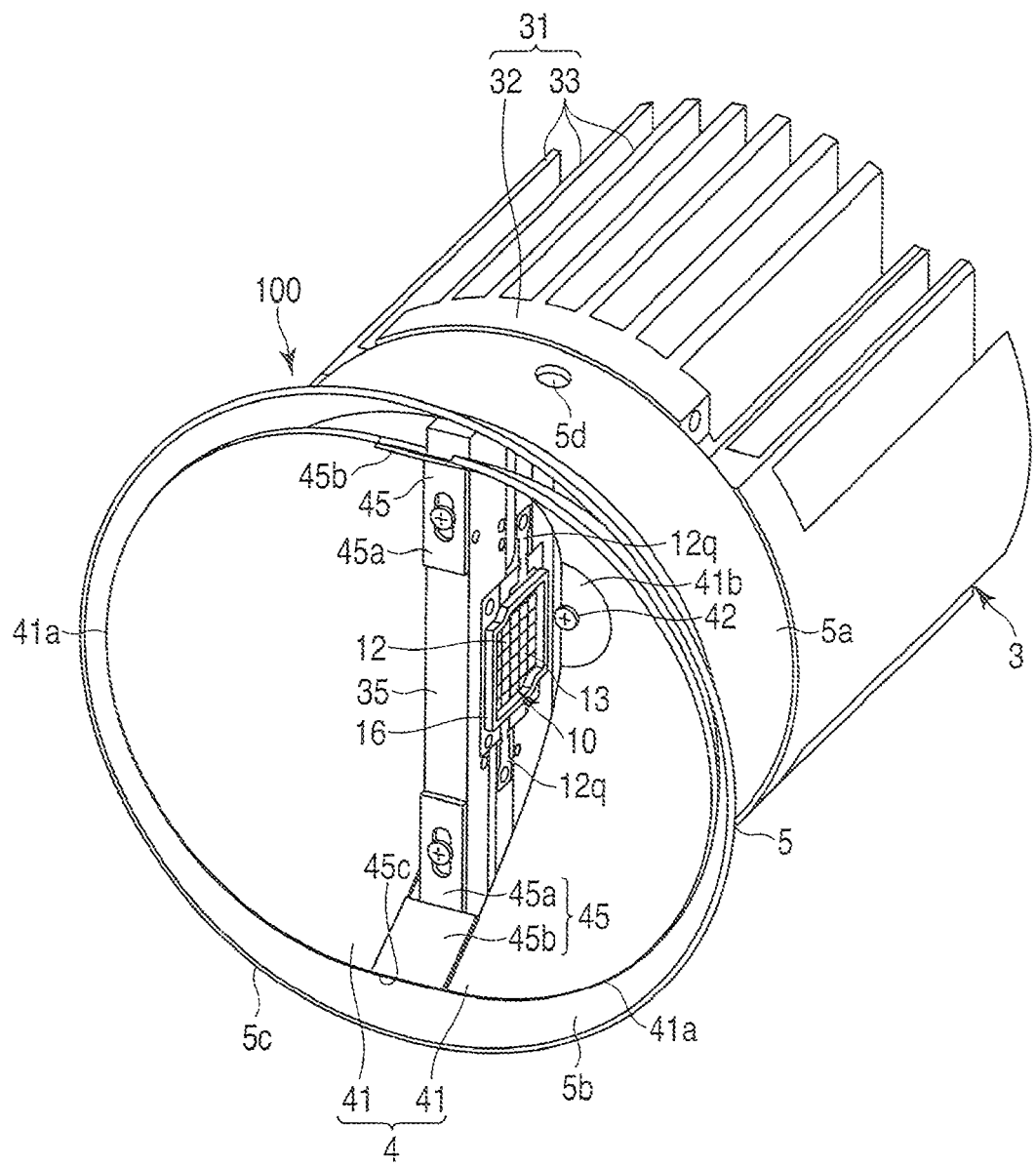
FIG. 7 is a perspective view showing a luminaire including a light-emitting apparatus of a fifth embodiment as a light source.
Figure 8:
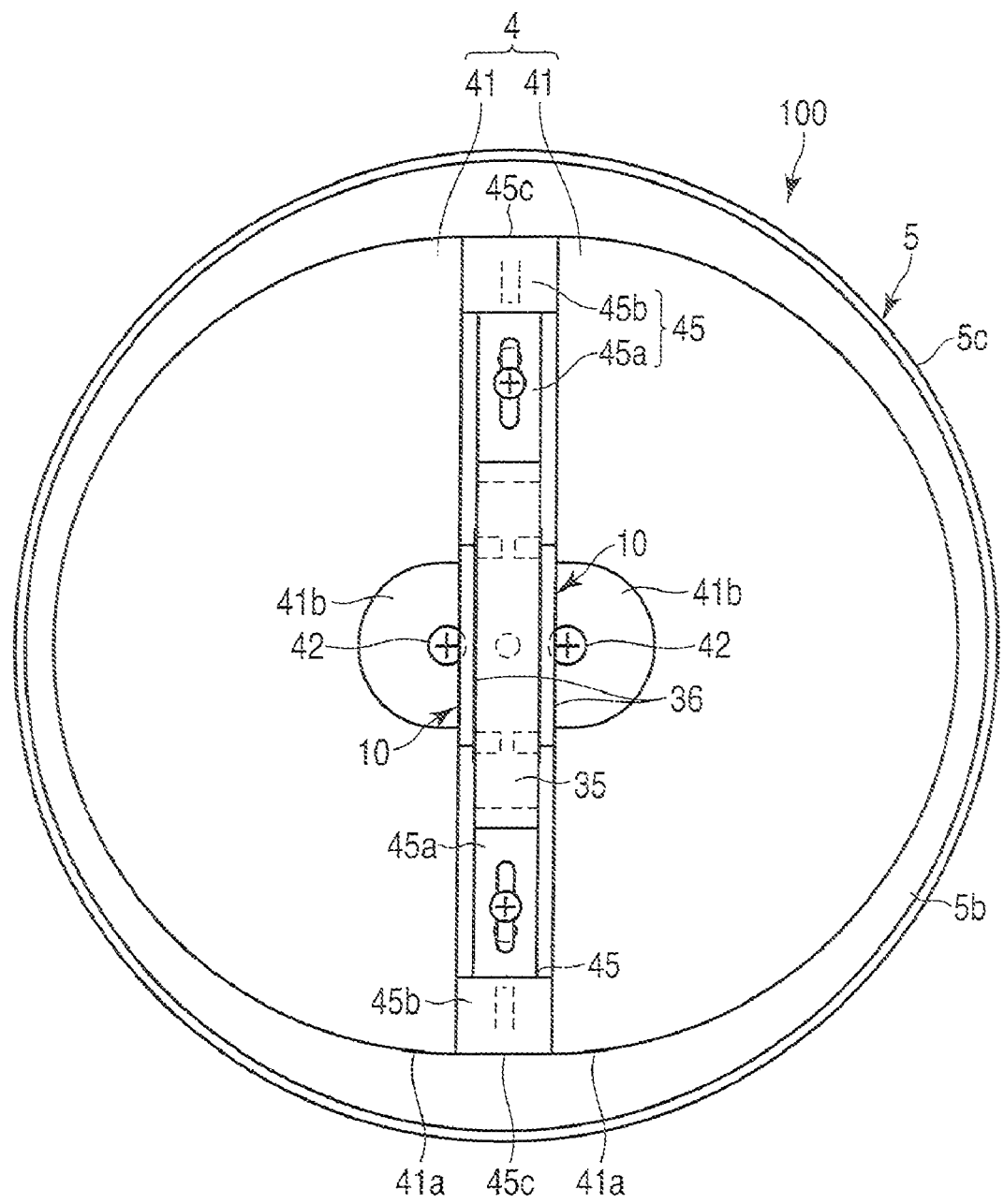
FIG. 8 is a front elevational view of the luminaire shown in FIG. 7 as viewed from the light radiation side.

A mirror holder 45 is fastened to an end of the heat receiving portion 35, which is away from a center of a luminous flux radiated from the luminaire 100 in the radial direction, with a screw from a front side. The mirror holder 45 integrally includes an attachment piece portion 45a, which is abutted against the heat receiving portion 35, and a close piece portion 45b, which is bent along the reflecting surfaces. The pair of concave mirror components 41 is away from the reflecting surfaces by the heat receiving portion 35 inserted therebetween. When the attachment piece portion 45a is fastened to the heat receiving portion 35 with screw, the close piece portion 45b is arranged so as to close a gap between the concave mirror components 41. With the configuration, as shown in FIGS. 7 and 8, the edges 41a of the concave mirror components 41 and tip edges 45c of the close piece portions 45b form a shape approximate to a circular shape.

As shown in FIGS. 9 and 10, the mirror support component 5, which functions also as a cover of the concave reflection mirror 4, is configured of a cylindrical base portion 5a and a support portion 5b that expands from an end of the base portion 5a in a horn-shape. The support portion 5b has a taper shape having a larger diameter than the base portion 5a and is formed in a circular shape when viewed from a front side as shown in FIG. 8. The mirror support component 5 is held between the base 32 and a peripheral portion of the concave reflection mirror 4 by abutting the base portion 5a against the front surface of the base 32 as well as causing the support portion 5b to come into contact with a peripheral back surface of the concave reflection mirror 4. The mirror support component 5 supports the concave reflection mirror 4 from a back side.

After the mirror support component 5 is previously arranged in the front surface side of the base 32, the mirror support component 5 is held by the concave mirror components 41 fastened to the base 32. An open edge 5c, which is formed in the support portion 5b of the mirror support component 5, is positioned on a front side with respect to the edges 41a of the concave mirror components 41 and a tip edge 45c of the mirror holder 45, that is, on the light outgoing side. As shown in FIG. 9, the concave reflection mirror 4 and the mirror holder 45 are accommodated in the mirror support component 5. A cable hole 5d shown in FIGS. 7 and 10 is formed so that insulation covered wires connected to the power supply terminals 12r pass therethrough.

When the luminaire 100 is lit, the respective LED chips 131 of the light-emitting apparatuses 10 emit light. The seal component 18 blended with the fluorescent material is excited by the light of the LED chips 131 and emits white light. The light radiated by the seal component 18 is reflected by the concave mirror component 41 that faces the light-emitting portions and caused to radiate in a light radiation direction of the luminaire 100. Projection patterns of the light reflected by the pair of concave mirror components 41 have an approximately circular shape and approximately match with each other on a to-be-illuminated subject which is located sufficiently far away from the luminaire 100 that functions as the spotlight.

A temperature of the substrates 111 of the light-emitting apparatuses 10 changes depending on whether the luminaire 100 is lit or extinguished. While the luminaire 100 is lit, temperatures of the substrates 111 and the heat receiving portion 35 rise due to the heat generated by the respective LED chips 131. In this case, the heat receiving portion 35 thermally expands more than the ceramic insulating bases 11 of the substrates 111. The substrates 111 are pressed by the heat receiving surfaces 35b of the heat receiving portion 35 due to the thermal expansion difference and convexly deformed in a direction away from the heat receiving surfaces 35b. Further, the copper reverse metallic components 14 directly bonded to back surfaces of the ceramic insulating bases 11 expand more than the insulating bases 11. Accordingly, the substrates 111 are convexly deformed due to the thermal expansion difference in a direction away from the heat receiving surfaces 35b of the heat receiving portion 35.

The light-emitting apparatuses 10 of the luminaire 100 of the fifth embodiment fasten the substrates 111 to the heat receiving portion 35 by passing the screws through the screw-passing holes 14D of the fastening portions 14C arranged in the reverse metallic components 14 without passing the screws through the insulating bases 11. Since no load is applied to the ceramic insulating bases 11, the insulating bases 11 are not broken due to screw fastening portions.

An amount of warping, which is generated when the DCB substrate is manufactured, was simulated using a quarter part corresponding to a quadrant of the light-emitting apparatus 10 of the fifth embodiment shown in FIG. 15 as a model. Assuming that the insulating base 11 was made of ceramics, the insulating base 11 had physical property values of a Young's modulus of 354000 [MPa], a Poisson's ratio of 0.26, a coefficient of linear expansion of $7.09 \times 10^{-6}$, and a thermal conductivity of 0.024 [W/mm·° C.]. Further, assuming that any of the obverse metallic component 12 and the reverse metallic component 14 was made of copper, physical property values of the obverse metallic component 12 and the reverse metallic component 14 were set to a Young's modulus of 130000 [MPa], a Poisson's ratio of 0.343, a coefficient of linear expansion of $17.7 \times 10^{-6}$, and a thermal conductivity of 0.398 [W/mm·° C.].

Further, a thickness of the insulating base 11 was fastened to 0.25 mm, and six models were tested by changing thicknesses of the obverse metallic component 12 and the reverse metallic component 14, respectively. As a temperature condition of a manufacturing process, a case, in which a temperature changed from a room temperature of 25° C. to 300° C. at which a process of eutectic bonding was simulated, was assumed, and a deformation amount of a substrate 111 in its entirety to a center of the substrate 111 was numerically analyzed.

Figure 16:
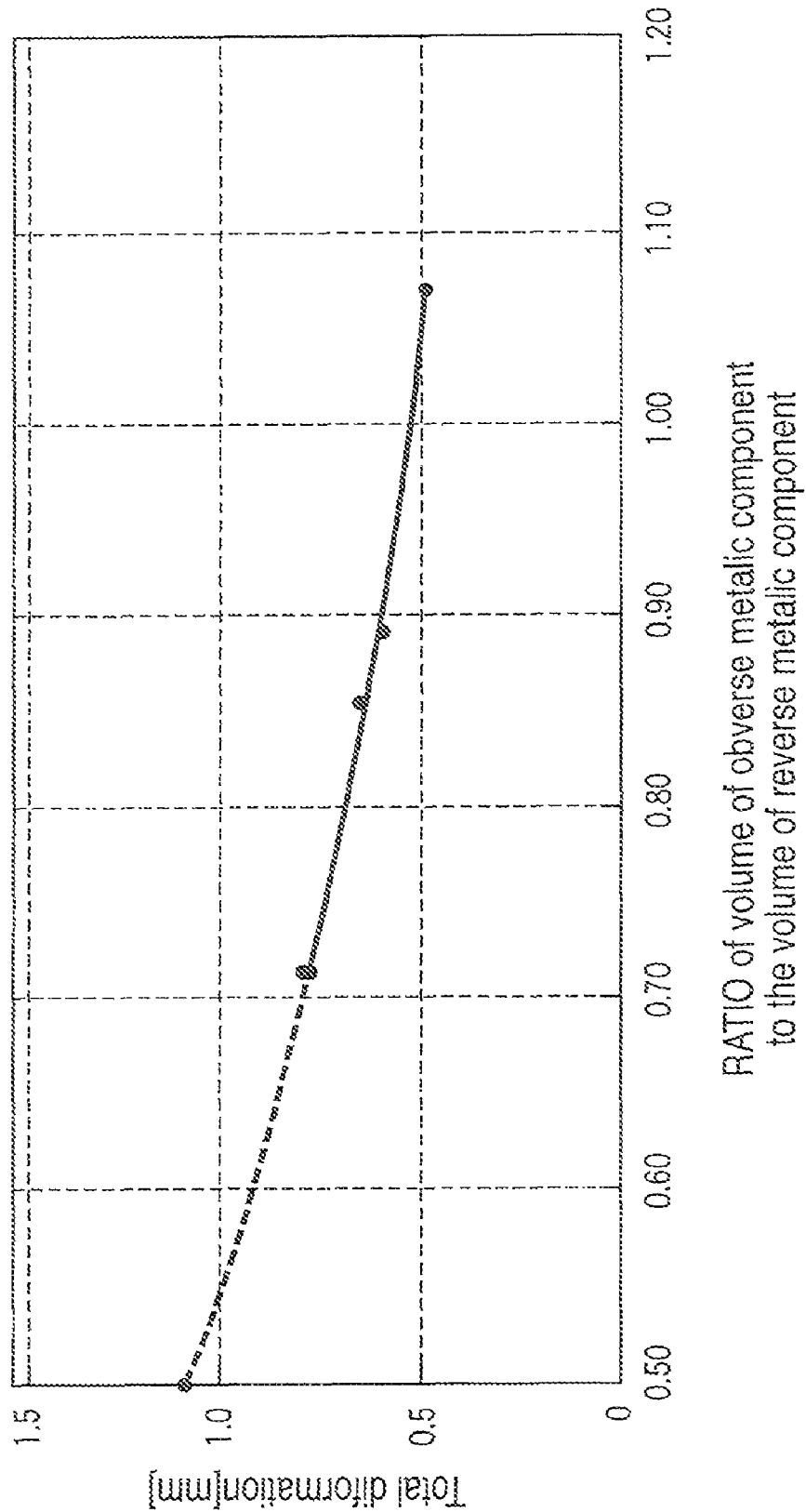
FIG. 16 is a graphic chart showing a relation between a ratio of volume of an obverse metallic component to a reverse metallic component of the light-emitting apparatus of FIG. 15 and an amount of deformation generated in an insulating base.

FIG. 16 shows the relation between a volume ratio of the obverse metallic component 12 to a volume of the reverse metallic component 14 and a total deformation of the substrate 111 based on a result of analysis. According to the relation, it is found that the volume ratio nearer to 1.00 less warps the substrate 111 in a range of the volume ratio of 0.7 or more and 1.07 or less. When the volume ratio is converted to the volume of the reverse metallic component 14 to a volume of the obverse metallic component 12, an amount of warping of the substrate is set within a allowable range at the time when the volume ratio is within a range of 93% to 140%.

In the relation of an amount of warping of a substrate to a volume ratio of the obverse metallic component 12 and the reverse metallic component 14 of the light-emitting apparatus 10 of the first embodiment, it is found that an amount of warping of a substrate is set within an allowable range when a thickness and a surface area of the reverse metallic component 14 are adjusted in a range in which a volume ratio of the reverse metallic component to the obverse metallic component 12 is set to 50% to 100%. At this time, the volume ratio nearer to 100% less warps the substrate.

In view of a result of the first embodiment and a result of simulation of the fifth embodiment, it will be said as follows. Even if the patterns of the pads and the power supply portions of the obverse metallic component are different, the amount of warping of the substrate does not change largely. The amount of warping of the substrate is set within the allowable range in a range of the volume ratio of the reverse metallic component to the obverse metallic component set to 50% to 140%. At this time, the volume ratio in the vicinity of 100% less, warps the substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting apparatus comprising:
an insulating base made of ceramic;
an obverse metallic component dividedly arranged on a front surface of the insulating base;
a semiconductor light-emitting element mounted on the obverse metallic component; and
a reverse metallic component arranged on a back surface of the insulating base and having a thickness the same as or smaller than a thickness of the obverse metallic component,
wherein a volume of the reverse metallic component is 50% or more of that of the obverse metallic component.

2. The light-emitting apparatus of claim 1, wherein an area of the reverse metallic component is larger than that of the obverse metallic component.

3. The light-emitting apparatus of claim 1, wherein the obverse metallic component comprises a strip-shaped portion arranged along a peripheral portion of the insulating base.

4. The light-emitting apparatus of claim 1, wherein the obverse metallic component comprises:
a pad arranged in a set pattern; and
a power supply portion electrically connected to the semiconductor light-emitting element to be supplied with power, and
the reverse metallic component comprises:
a fastening portion configured to project from a peripheral edge of the insulating base; and
a screw-passing portion formed in the fastening portion.

5. A luminaire comprising:
at least one light-emitting apparatus according to claim 1 as a light source.

* * * * *